US012254808B2

(12) United States Patent
Yuan et al.

(10) Patent No.: US 12,254,808 B2
(45) Date of Patent: Mar. 18, 2025

(54) GATE DRIVE CIRCUITS AND DISPLAY PANELS

(71) Applicant: WUHAN CHINA STAR OPTOELECTRONICS SEMICONDUCTOR DISPLAY TECHNOLOGY CO., LTD., Hubei (CN)

(72) Inventors: Bin Yuan, Hubei (CN); Fang Qin, Hubei (CN); Cheng Chen, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/628,691

(22) Filed: Apr. 6, 2024

(65) Prior Publication Data

US 2024/0296770 A1    Sep. 5, 2024

Related U.S. Application Data

(63) Continuation of application No. 18/357,252, filed on Jul. 24, 2023, now Pat. No. 12,008,940, which is a
(Continued)

(30) Foreign Application Priority Data

Mar. 1, 2023    (CN) .......................... 202310206893.4

(51) Int. Cl.
 *G09G 3/20*    (2006.01)
 *H03K 17/687*    (2006.01)
(52) U.S. Cl.
 CPC ........... *G09G 3/20* (2013.01); *H03K 17/6872* (2013.01); *G09G 2300/0819* (2013.01);
(Continued)

(58) Field of Classification Search
 CPC ............ G09G 3/20; G09G 2300/0819; G09G 2300/0852; G09G 2310/0267;
(Continued)

(56) References Cited

U.S. PATENT DOCUMENTS 11,854,482 B1*    12/2023    Lu ...................... G09G 3/3233
2023/0419912 A1*    12/2023    Zhou ................... G09G 3/3275

FOREIGN PATENT DOCUMENTS

| CN | 101640479 A | 2/2010 |
|----|-------------|--------|
| CN | 103928002 A | 7/2014 |

(Continued)

OTHER PUBLICATIONS

International Search Report in International application No. PCT/CN2023/089515, mailed on Nov. 23, 2023.
(Continued)

*Primary Examiner* — Abhishek Sarma
(74) *Attorney, Agent, or Firm* — PV IP PC; Wei Te Chung

(57) ABSTRACT

A gate drive circuit includes a plurality of gate drive units. Each of the gate drive units includes a stage transmission signal selection circuit, a pull-up control circuit, a pulse number reduction circuit, a first inversion circuit, a first output stage, and a second output stage, and can output a second gate control signal with a greater number of pulses and a first gate control signal with a less number of pulses. At least one of the stage transmission signal selection circuit, the first inversion circuit or the second output stage includes three transistors with the same channel type.

19 Claims, 18 Drawing Sheets

Related U.S. Application Data continuation of application No. PCT/CN2023/089515, filed on Apr. 20, 2023.

(52) U.S. Cl.
CPC ............... *G09G 2300/0852* (2013.01); *G09G 2310/0267* (2013.01); *G09G 2310/0286* (2013.01); *G09G 2310/08* (2013.01); *G09G 2330/021* (2013.01)

(58) Field of Classification Search
CPC ....... G09G 2310/0286; G09G 2310/08; G09G 2330/021; G09G 3/3266; H03K 17/6872
See application file for complete search history.

(56) References Cited

FOREIGN PATENT DOCUMENTS

| | | | | |
|---|---|---|---|---|
| CN | 105096903 A | | 11/2015 | |
| CN | 105390116 A | | 3/2016 | |
| CN | 108932930 A | | 12/2018 | |
| CN | 110033734 A | * | 7/2019 | ........... G09G 3/3208 |
| CN | 110070838 A | | 7/2019 | |
| CN | 111223452 A | | 6/2020 | |
| CN | 113794469 A | | 12/2021 | |
| WO | 2021179384 A1 | | 9/2021 | |

OTHER PUBLICATIONS

Written Opinion of the International Search Authority in International application No. PCT/CN2023/089515, mailed on Nov. 23, 2023.

\* cited by examiner

GATE DRIVE CIRCUITS AND DISPLAY PANELS

CROSS-REFERENCE TO RELATED APPLICATIONS

This application is a continuation application of U.S. application Ser. No. 18/357,252, filed on Jul. 24, 2023, which is a US national phase application based upon an International Application No. PCT/CN2023/089515, field on Apr. 20, 2023, which claims priority to Chinese Patent Application No. 202310206893.4, filed on Mar. 1, 2023. The entire disclosures of the above applications are incorporated herein by reference.

TECHNICAL FIELD

The present application relates to manufacturing of display panels, and more particularly, to gate drive circuits and display panels.

BACKGROUND

With continuous update of a pixel circuit, a gate drive circuit also needs to be improved to provide various gate control signals required by the pixel circuit.

However, in the conventional gate drive circuit, pulses of various gate control signals that can be provided by a gate drive unit are limited in terms of time, number, or the like, and cannot meet the requirement of driving the pixel circuit corresponding to the gate drive unit.

SUMMARY

According to a first aspect, the present application provides a gate drive circuit including a plurality of cascaded gate drive units, and one gate drive unit includes a stage transmission signal selection circuit, a pull-up control circuit, a pulse number reduction circuit, a first inversion circuit, a first output stage, and a second output stage. The stage transmission signal selection circuit is electrically connected between a first wiring and a first node. The pull-up control circuit controls a potential of the second node according to a potential of the first node and a potential of the first clock signal. The pulse number reduction circuit is electrically connected to the second node and a third node, and a control terminal of the pulse number reduction circuit is electrically connected to a reset line. The first inversion circuit is connected to the second node and the fourth node. The first output stage outputs a first gate control signal according to a potential of the third node and a potential of the fourth node. A second output stage output a second gate control signal based on a potential of the second node, and the second gate control signal has more pulses in a frame than pulses of the first gate control signal in a frame. At least one of the stage transmission signal selection circuit, the first inversion circuit, and the second output stage includes three transistors of the same channel type.

In some embodiments, at least one of the stage transmission signal selection circuit, the first inversion circuit, and the second output stage includes a first transistor, a second transistor, and a third transistor. One of a source and a drain of the first transistor is electrically connected to a low potential line, a gate of the first transistor is electrically connected to the first wiring, and the first transistor is a P-channel type thin film transistor. A gate of the second transistor is electrically connected to a gate of the first transistor, one of a source and a drain of the second transistor is electrically connected to a high potential line, other of the source and the drain of the second transistor is electrically connected to the first node, and the second transistor is a P-channel thin film transistor. A gate of the third transistor is electrically connected to other of the source and the drain of the first transistor, one of a source and a drain of the third transistor is electrically connected to a low potential line, other of the source and the drain of the third transistor is electrically connected to the first node, and the third transistor is a P-channel thin film transistor.

In some embodiments, a ratio of a channel width of the first transistor to a channel length of the first transistor is greater than 1.5:1, a ratio of a channel width of the second transistor to a channel length of the second transistor is in a range of 0.5:1-3:1, and a ratio of a channel width of the third transistor to a channel length of the third transistor is in a range of 0.5:1-3:1.

In some embodiments, the pulse number reduction circuit includes a fourth transistor, one of a source and drain of the fourth transistor is electrically connected to the second node, other of the source and the drain of the fourth transistor is electrically connected to the third node, and a gate of the fourth transistor is electrically connected to the reset line. The fourth transistor is a P-channel type thin film transistor.

In some embodiments, a ratio of a channel width of the fourth transistor to a channel length of the fourth transistor is greater than or equal to 0.5 and less than or equal to 1.5.

In some embodiments, the pulse number reduction circuit further includes a first capacitor, a terminal of the first capacitor is electrically connected to the gate of the fourth transistor, and another terminal of the first capacitor is electrically connected to the other of the source and the drain of the fourth transistor.

In some embodiments, the first output stage includes a pull-up transistor and a second capacitor. A gate of the pull-up transistor is electrically connected to the third node, one of a source and a drain of the pull-up transistor is electrically connected to a second clock line, and other of the source and the drain of the pull-up transistor outputs a first gate control signal. A terminal of the second capacitor is electrically connected to the gate of the pull-up transistor and another terminal of the second capacitor is electrically connected to the other of the source and the drain of the pull-up transistor. A ratio of capacitance of the first capacitor to capacitance of the second capacitor is greater than or equal to 0.5.

In some embodiments, an output terminal of the second output stage is electrically connected to a second gate control line for transmitting the second gate control signal, the second gate control signal including a first positive pulse and a second positive pulse in sequence in a frame; and an output terminal of the first output stage is electrically connected to a first gate control line for transmitting the first gate control signal, the first gate control signal including a first negative pulse in a frame.

In some embodiments, in a frame, a duration of the second positive pulse is longer than a duration of the first negative pulse, and the duration of the first negative pulse is within the duration of the second positive pulse.

In some embodiments, a control terminal of the pull-up control circuit is electrically connected to a first clock line for transmitting the first clock signal, the first output stage is electrically connected to a second clock line for transmitting a second clock signal, a difference between phase of the first clock signal and phase of the second clock signal is 180°. Each of a falling edge of the second clock signal, a falling edge of the second positive pulse, and a rising edge of the first negative pulse is within a duration of a positive pulse of the first clock signal.

According to a second aspect, the present application provides a display panel including a pixel circuit including a writing transistor for controlling an input of a data signal and a compensation transistor for controlling the input of the data signal to a gate of a drive transistor, and a gate drive circuit according to at least one embodiment described above. An output terminal of the first output stage is electrically connected to a gate of the writing transistor, and an output terminal of the second output stage is electrically connected to a gate of the compensation transistor.

In some embodiments, the first gate control signal is an N-th stage negative pulse scanning signal, the second gate control signal is an N-th stage positive pulse scanning signal, and the control terminal of the pulse number reduction circuit is connected to an (N-X)-th stage positive pulse scanning signal, and where N is an integer greater than or equal to 1 and X is an integer greater than or equal to 2.

In some embodiments, the pixel circuit further includes a first initialization transistor configured to initialize a gate potential of the drive transistor, and the gate of the first initialization transistor receives the (N-X)-th stage positive pulse scanning signal.

In some embodiments, the stage transmission signal selection circuit receives one of a start control signal and an (N-Y)-th stage positive pulse scanning signal, where Y is an integer greater than or equal to 1.

DETAILED DESCRIPTION

In order that objectives, technical solutions, and effects of the present application may be made clearer and more explicit, the present application will be described in further detail below in some embodiment with reference to the accompanying drawings. It is to be understood that the specific embodiments described herein are merely illustrative of the present application and are not intended to limit the present application.

Furthermore, the terms "first" and "second" are used for descriptive purposes only and are not to be construed as indicating or implying relative importance or implicitly indicating the number of indicated technical features. Therefore, the features defined by the terms "first" and "second" may explicitly or implicitly include one or more of the features, and in the description of the present invention, "a/the plurality of" means two or more unless expressly and specifically defined otherwise.

Figure 1:
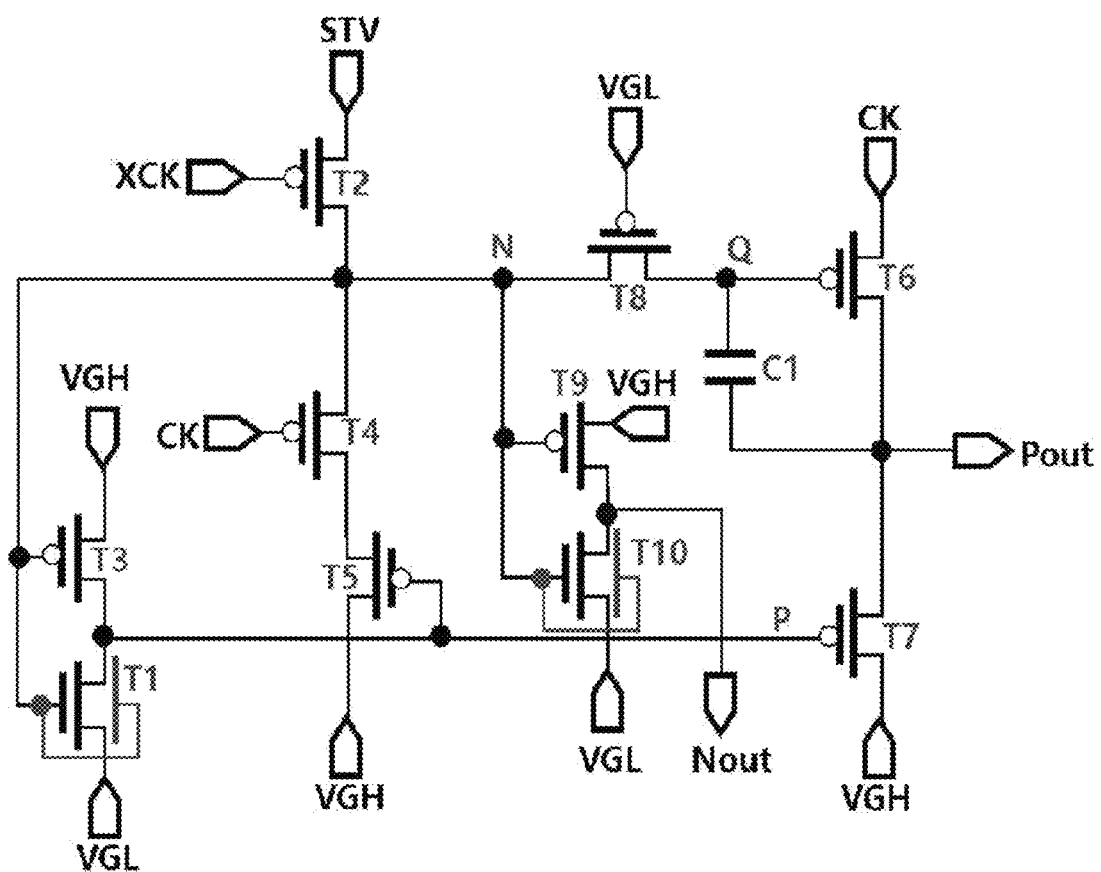
FIG. 1 is a schematic structural diagram of a gate drive circuit in the related art.
Figure 2:
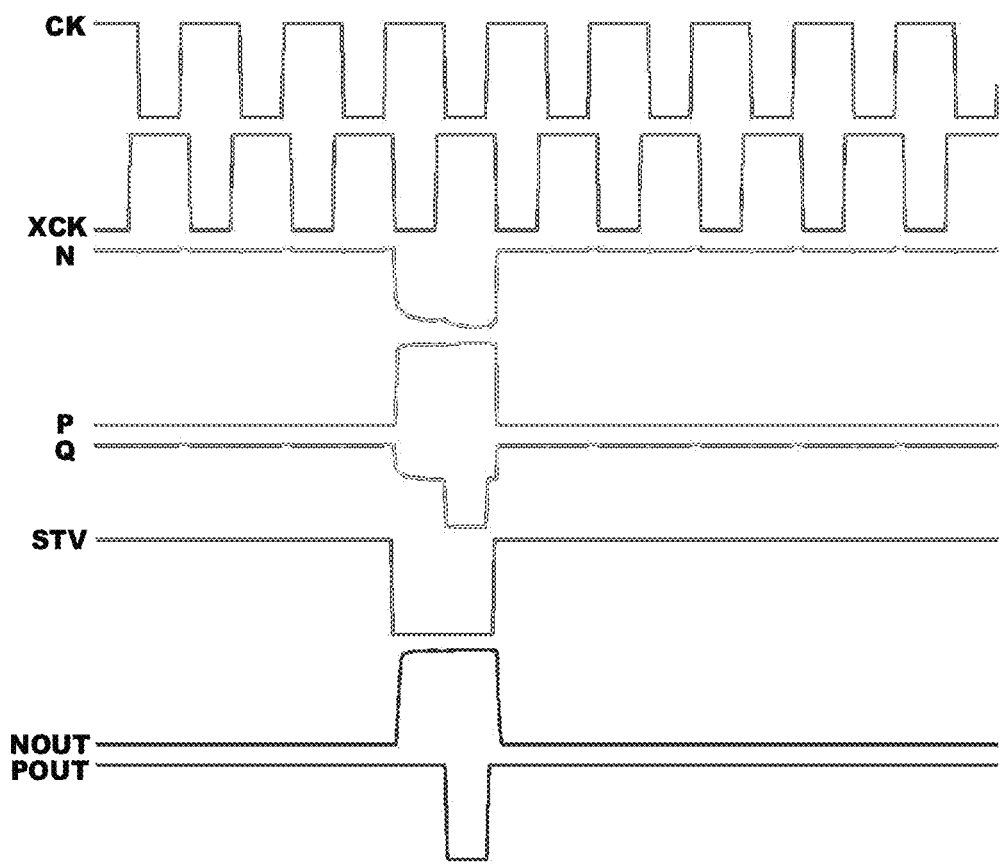
FIG. 2 is a schematic timing diagram of the gate drive circuit shown in FIG. 1.

Refer to FIGS. 1 and 2. FIG. 1 is a schematic structural diagram of a current gate drive circuit. FIG. 2 is a timing diagram of the gate drive circuit shown in FIG. 1. Such a gate drive circuit may simultaneously output a gate control signal (Nout) having a positive pulse and a gate control signal (Pout) having a negative pulse. However, there is a disadvantage in the gate drive circuit that only one of the gate control signal (Nout) with the positive pulse and the gate control signal (Pout) with the negative pulse may be output in one frame, but both of them cannot be output in one frame at the same time, which cannot meet the requirement of driving the pixel circuit corresponding to the gate drive circuit.

Figure 3:
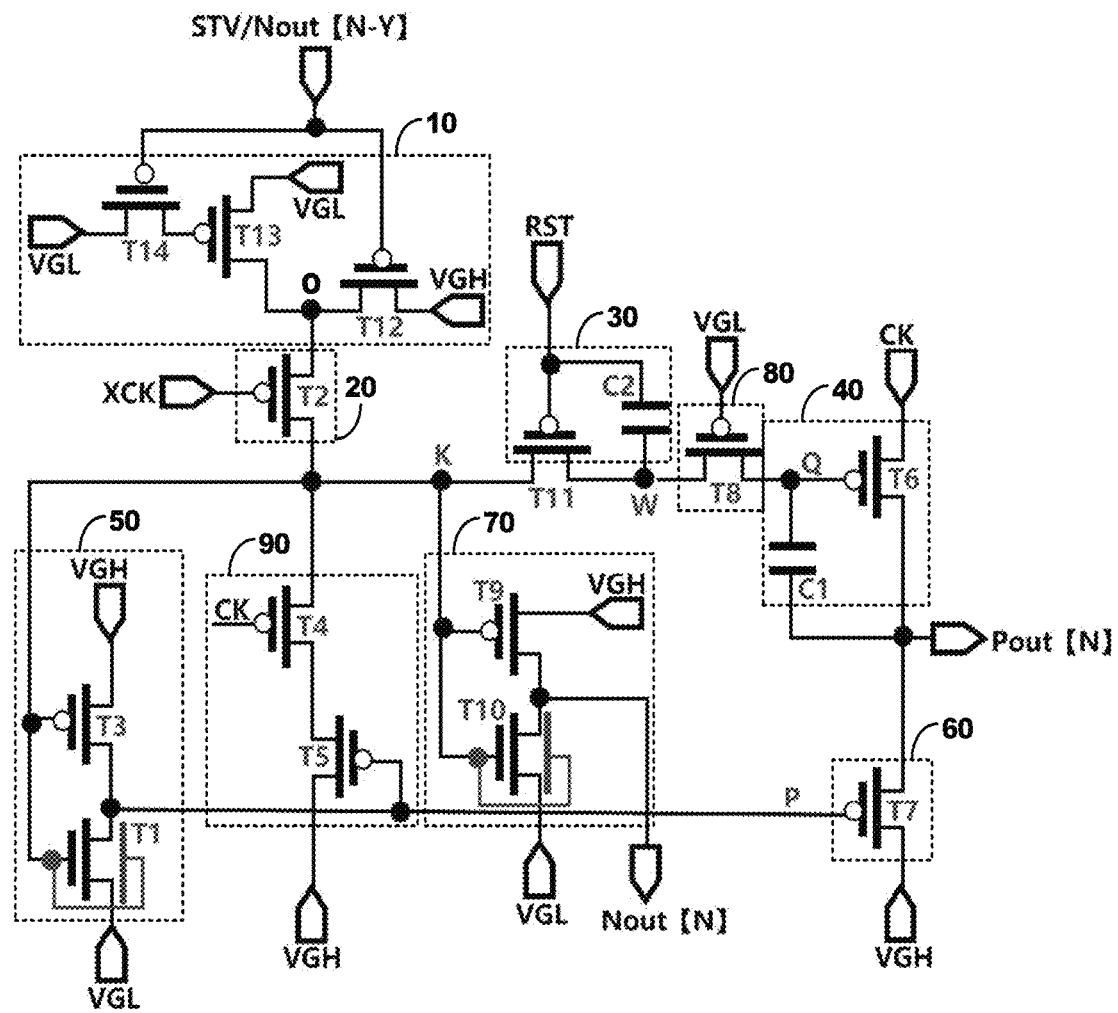
FIG. 3 is a schematic structural diagram of a gate drive circuit according to an embodiment of the present application.

In view of this, an embodiment of the present application provides a gate drive circuit. Referring to FIGS. 1 to 19, the gate drive circuit includes a plurality of cascaded gate drive units. At least one of the gate drive units includes at least one of a stage transmission signal selection circuit 10, a pull-up control circuit 20, a pulse number reduction circuit 30, a first inversion circuit 50, a first output stage, or a second output stage 70, as shown in FIG. 3.

The stage transmission signal selection circuit 10 is electrically connected to a first wiring and a first node O.

The pull-up control circuit 20 controls a potential of a second node K according to a potential of the first node O and a potential of a first clock signal.

The pulse number reduction circuit 30 is electrically connected to the second node K and a third node Q, and a control terminal of the pulse number reduction circuit 30 is electrically connected to a reset line.

The first inversion circuit 50 is connected to the second node K and a fourth node P.

The first output stage outputs a first gate control signal according to a potential of the third node Q and a potential of the fourth node P.

The second output stage 70 outputs a second gate control signal according to the potential of the second node K. A number of pulses of the second gate control signal in one frame is greater than a number of pulses of the first gate control signal in one frame.

At least one of the stage transmission signal selection circuit 10, the first inversion circuit 50, and the second output stage 70 includes three transistors of the same channel type.

It will be appreciated that the gate drive circuit according an embodiment of the present application may output a second gate control signal with more pulses through the stage transmission signal selection circuit 10, the pull-up control circuit 20, and the second output stage 70, and may also take the second gate control signal as a stage transmission signal between different gate drive units. In addition, the gate drive circuit according an embodiment of the present application may output a first gate control signal with less pulses through the stage transmission signal selection circuit 10, the pull-up control circuit 20, the pulse number reduction circuit 30, the first inversion circuit 50, and the first output stage. Therefore, the gate drive circuit according an embodiment of the present application may meet a need of the pixel circuit for the pulse of the gate control signal in terms of time, number, or the like in a frame, and the pixel circuit is driven to improve display quality of pictures.

In addition, in the gate drive circuit and the display panel according an embodiment of the present application, by configuring at least one of the stage transmission signal selection circuit 10, the first inversion circuit 50, and the second output stage 70 including three transistors of the same channel type, the at least one of the stage transmission signal selection circuit 10, the first inversion circuit 50, and the second output stage 70 with an inverter effect is formed from less transistors with the same channel type, as compared with a current inversion circuit formed by two transistors of different channel types or four transistors of the same channel type. Therefore, the manufacturing process is simplified and the dynamic performance is improved.

An input terminal of the stage transmission signal selection circuit 10 is electrically connected to a start control line or an (N-Y)-th stage positive pulse scanning line, where N is an integer greater than or equal to 1 and Y is an integer greater than or equal to 1.

An input terminal of the pull-up control circuit 20 is electrically connected to an output terminal of the stage transmission signal selection circuit 10, and a control terminal of the pull-up control circuit 20 is electrically connected to the first clock line.

An input terminal of the pulse number reduction circuit 30 is electrically connected to an output terminal of the pull-up control circuit 20, and the control terminal of the pulse number reduction circuit 30 is electrically connected to the reset line.

A control terminal of the pull-up circuit 40 is electrically connected to an output terminal of the pulse number reduction circuit 30, an input terminal of the pull-up circuit 40 is electrically connected to a second clock line, and an output terminal of the pull-up circuit 40 is electrically connected to an N-th stage negative pulse scanning line. An input terminal of the first inversion circuit 50 is electrically connected to the output terminal of the pull-up control circuit 20.

A control terminal of the pull-down circuit 60 is electrically connected to an output terminal of the first inversion circuit 50, an input terminal of the pull-down circuit 60 is electrically connected to a high potential line, and an output terminal of the pull-down circuit 60 is electrically connected to the N-th stage negative pulse scanning line.

An input terminal of the second output stage 70 is electrically connected to the input terminal of the pull-up control circuit 20, an output terminal of the second output stage 70 is electrically connected to the N-th stage positive pulse scanning line, and the number of positive pulses output by the N-th stage positive pulse scanning line in one frame is greater than the number of negative pulses output by the N-th stage negative pulse scanning line in one frame.

In an embodiment, the first output stage includes a pull-up circuit 40 and a pull-down circuit 60.

It should be noted that the first wiring may be the start control line or the (N-Y)-th stage positive pulse scanning line. When N-Y is less than or equal to 0, the first wiring is the start control line. The N-th stage positive pulse scanning line taken as the second gate control line is used to transmit an N-th stage positive pulse scanning signal Nout[N], i.e., the second gate control signal. The N-th stage negative pulse scanning line, i.e., the first gate control line, is used to transmit the N-th stage negative pulse scanning signal Pout[N], i.e., the first gate control signal.

In an embodiment, the pulse number reduction circuit 30 includes a fourth transistor T11, one of a source and a drain of the fourth transistor T11 is electrically connected to the output terminal of the pull-up control circuit 20, the other of the source and the drain of the fourth transistor T11 is electrically connected to the control terminal of the pull-up circuit 40, and a gate of the fourth transistor T11 is electrically connected to the reset line. The fourth transistor T11 is a P-channel type thin film transistor. The reset line is a positive pulse scanning line at a (N-X)-th level, and X is an integer greater than or equal to 2.

It is noted that the output terminal of the pull-up control circuit 20 is the second node K. The control terminal of the pull-up circuit 40 is the third node Q. The other of the source and the drain of the fourth transistor T11 is a node W. The pulse number reduction circuit 30 is configured to reduce a double pulse at the second node K in one frame to a single pulse at the third node Q in one frame. For example, a pulse of the double pulse first occurring in one frame at the second node K may be eliminated, while the other of the double pulse occurring in the same frame may be retained.

In an embodiment, a ratio of a channel width of the fourth transistor T11 to a channel length of the fourth transistor T11 is greater than or equal to 0.5 and less than or equal to 1.5.

It should be noted that in the present embodiment, the output stability of the N-th stage negative pulse scanning signal Pout[N] may be advantageously ensured, and the phenomenon of coupling pull-down prior to the arrival of the negative pulse may be avoided.

In an embodiment, the pulse number reduction circuit 30 further includes a first capacitor C2. A terminal of the first capacitor C2 is electrically connected to the gate of the fourth transistor T11, and the other terminal of the first capacitor C2 is electrically connected to the other of the source and the drain of the fourth transistor T11.

It should be noted that in the present embodiment, the output stability of the N-th stage negative pulse scanning signal Pout[N] may be advantageously further improved.

In an embodiment, the pull-up circuit 40 includes a pull-up transistor T6 and a second capacitor C1. A gate of the pull-up transistor T6 is electrically connected to one of the source and the drain of the fourth transistor T11. One of the source and the drain of the pull-up transistor T6 is electrically connected to the second clock line, and the other of the source and the drain of the pull-up transistor T6 is electrically connected to the N-th stage negative pulse scanning line. A terminal of the second capacitor C1 is electrically connected to the gate of the pull-up transistor T6, and the other terminal of the second capacitor C1 is electrically connected to the other of the source and the drain of the pull-up transistor T6. A ratio of capacitance of the first capacitor C2 to capacitance of the second capacitor C1 is greater than or equal to 0.5.

It should be noted that in the present embodiment, the ratio of the capacitance of the first capacitor C2 to the capacitance of the second capacitor C1 is set to further ensure the output stability of the N-th stage negative pulse scanning signal Pout[N], thereby avoiding the phenomenon of coupling pull-down prior to the arrival of the negative pulse.

In an example, the capacitance of the first capacitor C2 may be greater than or equal to 50 fF. The capacitance of the second capacitor C1 may be greater than or equal to 100 fF.

A ratio of a channel width of the pull-up transistor T6 to a channel length of the pull-up transistor T6 may be greater than 30:1, thereby further ensuring the output stability of the N-th stage negative pulse scanning signal Pout[N]. The pull-up transistor T6 may be a P-channel type thin film transistor.

In an embodiment, at least one of the stage transmission signal selection circuit 10, the first inversion circuit 50, and the second output stage 70 includes a first transistor T14, a second transistor T12, and a third transistor T13. One of a source and a drain of the first transistor T14 is electrically connected to a low potential line. A gate of the first transistor T14 is electrically connected to the start control line or the (N-Y)-th stage positive pulse scanning line. The first transistor T14 is a P-channel type thin film transistor. A gate of the second transistor T12 is electrically connected to the gate of the first transistor T14. One of a source and a drain of the second transistor T12 is electrically connected to the high potential line. The second transistor T12 is a P-channel type thin film transistor. A gate of the third transistor T13 is electrically connected to the other of the source and the drain of the first transistor T14. One of a source and a drain of the third transistor T13 is electrically connected to the low potential line. The other of the source and the drain of the third transistor T13 is electrically connected to the other of the source and the drain of the second transistor T12. The third transistor T13 is a P-channel type thin film transistor.

It should be noted that the stage transmission signal selection circuit 10 according to the present embodiment not only has an inverter effect (that is, an input signal and an output signal thereof have opposite potentials at the same moment), but also makes the N-th stage positive pulse scanning signal Nout[N] as the stage transmission signal between the gate drive units. Otherwise, no cascade between gate drive units, which may cause the gate drive circuit to fail to normally supply the scanning signal.

A ratio of a channel width of the first transistor T14 to a channel length of the first transistor T14 may greater than 1.5:1. A ratio of a channel width of the second transistor T12 to a channel length of the second transistor T12 may be in a range of 0.5:1-3:1. A ratio of a channel width of the third transistor T13 to a channel length of the third transistor T13 may be in a range of 0.5:1-3:1. This enables a more accurate implementation of the role played by the stage transmission signal selection circuit 10 in the present application.

A high potential line is used to transmit a high potential signal VGH. The N-channel type thin film transistor is turned on or the P-channel type thin film transistor is turned off, in response to the high potential signal VGH. The low potential line is used to transmit a low potential signal VGL. The P-channel type thin film transistor is turned on or the N-channel type thin film transistor is turned off, in response to the low potential signal VGL.

In an embodiment, the pull-up control circuit 20 includes a pull-up control transistor T2. One of a source and a drain of the pull-up control transistor T2 is electrically connected to an output terminal of the stage transmission signal selection circuit 10. The other of the source and the drain of the pull-up control transistor T2 is electrically connected to the input terminal of the pulse number reduction circuit 30. A gate of the pull-up control transistor T2 is electrically connected to the first clock line.

It is noted that the pull-up control transistor T2 may be a P-channel type thin film transistor. A ratio of a channel width of the pull-up control transistor T2 to a channel length of the pull-up control transistor T2 is in a range of 0.5:1-3:1.

In an embodiment, the first inversion circuit 50 or the stage transmission signal selection circuit 10 may further include a transistor T3 and a transistor T1. One of a source and a drain of the transistor T3 is electrically connected to the high potential line. The other of the source and the drain of the transistor T3 is electrically connected to one of the source and the drain of the transistor T1 and the control terminal of the pull-down circuit 60. The other of the source and the drain of the transistor T1 is electrically connected to the low potential line. The output terminal of the pull-up control circuit 20 is electrically connected to the gate of the transistor T3. The first gate of the transistor T1, and the second gate of the transistor T1.

It is noted that the transistor T3 is a P-channel type thin film transistor. The transistor T1 is a double-gate N-channel type thin film transistor. Therefore, the dynamic performance of the transistor T3 and the transistor T1 may be improved, and the dynamic performance of the first inversion circuit 50 may be improved.

A ratio of a channel width of the transistor T3 to a channel length of the transistor T3 is in a range of 0.5:1-3:1. A ratio of a channel width of transistor T1 to a channel length of transistor T1 is greater than or equal to 2:1.

In an embodiment, the pull-down circuit 60 includes a pull-down transistor T7. One of a source and a drain of the pull-down transistor T7 is electrically connected to the high potential line. The other of the source and the drain of the pull-down transistor T7 is electrically connected to the N-th stage negative pulse scanning line. A gate of the pull-down transistor T7 is electrically connected to the output terminal (i.e., the fourth node P) of the first inversion circuit 50.

It is noted that the pull-down transistor T7 may be a P-channel type thin film transistor. The desired N-th stage negative pulse scanning signal Pout[N] may be modulated based on both the pull-down circuit 60 and the pull-up circuit 40.

A ratio of a channel width of the pull-down transistor T7 to a channel length of the pull-down transistor T7 is greater than or equal to 30:1.

In an embodiment, the second output stage 70 or the stage transmission signal selection circuit 10 may further include a transistor T9 and a transistor T10. One of a source and a drain of the transistor T9 is electrically connected to the high potential line. The other of the source and the drain of the transistor T9 is electrically connected to one of a source and a drain of the transistor T10 and the N-th stage positive pulse scan line. The other of the source and the drain of the transistor T10 is electrically connected to the low potential line. The output terminal of the pull-up control circuit 20 is electrically connected to a gate of the transistor T9, a first gate of the transistor T10, and a second gate of the transistor T10.

It is noted that the transistor T9 is a P-channel type thin film transistor. The transistor T10 is a double gate N-channel type thin film transistor. Therefore, the dynamic performance of the transistor T9 and the transistor T10 may be improved, and the dynamic performance of the second output stage 70 may be improved.

A ratio of a channel width of the transistor T9 to a channel length of the transistor T9 is greater than or equal to 30:1. A ratio of a channel width of the transistor T10 to a channel length of the transistor T10 is greater than or equal to 30:1.

In an embodiment, the N-th stage gate drive unit further includes a leakage prevention circuit 80. A terminal of the leakage prevention circuit 80 is electrically connected to an output terminal of the pulse number reduction circuit 30. The other terminal of the leakage prevention circuit 80 is electrically connected to the control terminal of the pull-up circuit 40. A control terminal of the leakage prevention circuit 80 is electrically connected to the low potential line.

It should be noted that the leakage prevention circuit 80 may be configured to prevent the charge of the third node Q from flowing to the node W, thereby facilitating the potential stability of the third node Q.

In an embodiment, the leakage prevention circuit 80 includes a leakage prevention transistor T8. One of a source and a drain of the leakage prevention transistor T8 is electrically connected to the output terminal of the pulse number reduction circuit 30. The other of the source and the drain of the leakage prevention transistor T8 is electrically connected to the control terminal of the pull-up circuit 40. A gate of the leakage prevention transistor T8 is electrically connected to the low potential line.

It should be noted that the leakage prevention transistor T8 may be a P-channel type thin film transistor. Alternatively, the leakage prevention transistor T8 may be an N-channel thin film transistor, and in this case, a gate of the leakage prevention transistor T8 may be electrically connected to the high potential line.

A ratio of a channel width of the leakage-proof transistor T8 to a channel length of the leakage-proof transistor T8 is in a range of 0.5:1-3:1.

In an embodiment, the N-th stage gate drive unit further includes a feedback circuit 90 including a transistor T4 and a transistor T5. One of a source and a drain of the transistor T4 is electrically connected to the output terminal of the pull-up control circuit 20. A gate of the transistor T4 is electrically connected to the second clock line. The other of the source and the drain of the transistor T4 is electrically connected to one of a source and a drain of the transistor T5. The other of the source and the drain of the transistor T5 is electrically connected to the high potential line. A gate of the transistor T5 is electrically connected to an output terminal of the first inversion circuit 50.

A ratio of a channel width of the transistor T4 to a channel length of the transistor T4 is in a range of 0.5:1-3:1. A ratio of a channel width of the transistor T5 to a channel length of the transistor T5 is in a range of 0.5:1-3:1.

It should be noted that the feedback circuit 90 may maintain the second node K at a high potential according to the potential of the fourth node P and the potential transmitted via the second clock line. That is, in the case that the fourth node P is at a low potential and the second clock signal CK is at a low potential, the potential of the second node K may be changed to the potential of the high potential signal VGH through the high potential line.

It should be noted that the N-th stage positive pulse scanning line is used to transmit the N-th stage positive pulse scanning signal Nout[N]. The N-th stage negative pulse scan line is used to transmit the N-th stage negative pulse scanning signal Pout[N]. The first clock line is used to transmit the first clock signal XCK. The second clock line is used to transmit the second clock signal CK. The start control line is used to transmit the start control signal STV The (N-Y)-th stage positive pulse scan line is used to transmit the (N-Y)-th stage positive pulse scanning signal Nout[N-Y]. The (N-X)-th stage positive pulse scan line is used to transmit the (N-X)-th stage positive pulse scanning signal Nout[N-X]. The reset line is used to transmit the reset signal RST.

Figure 4:
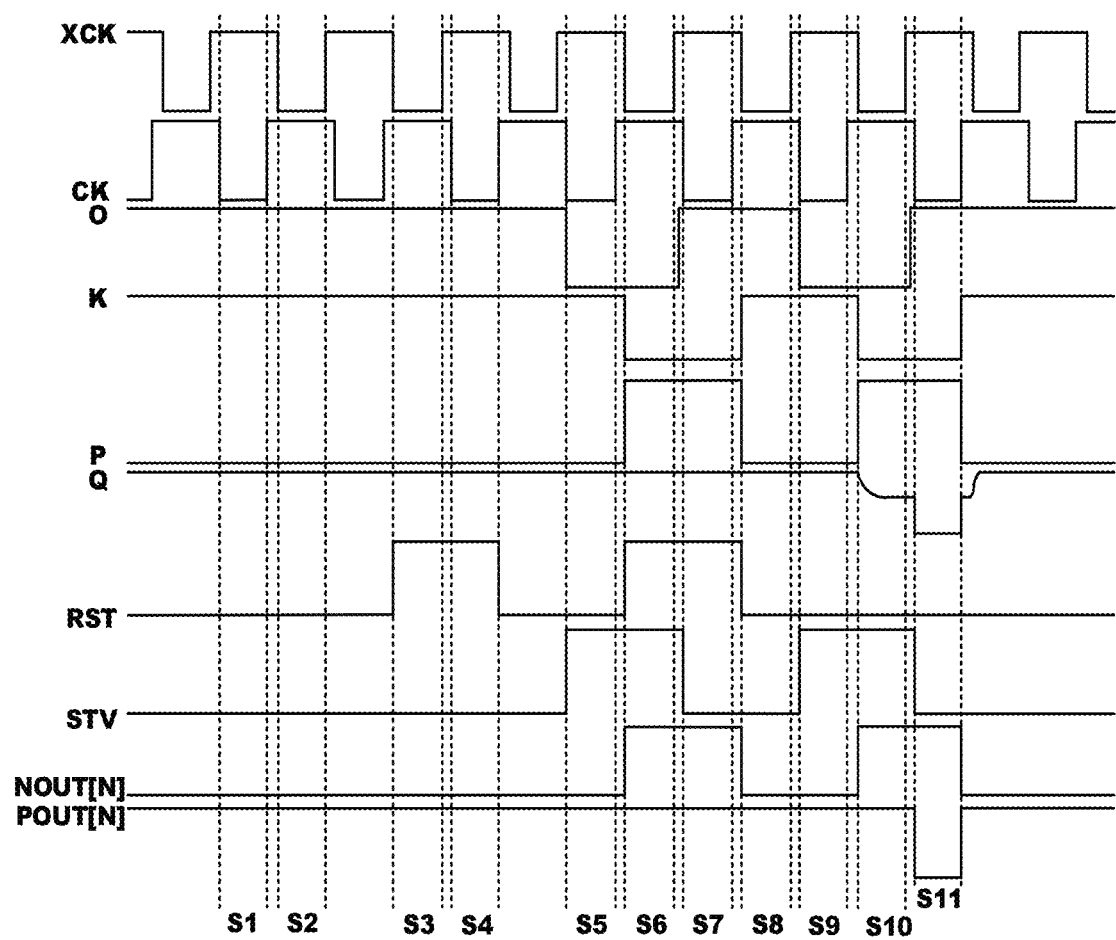
FIG. 4 is a schematic timing diagram of a gate drive circuit shown in FIG. 3.
Figure 5:
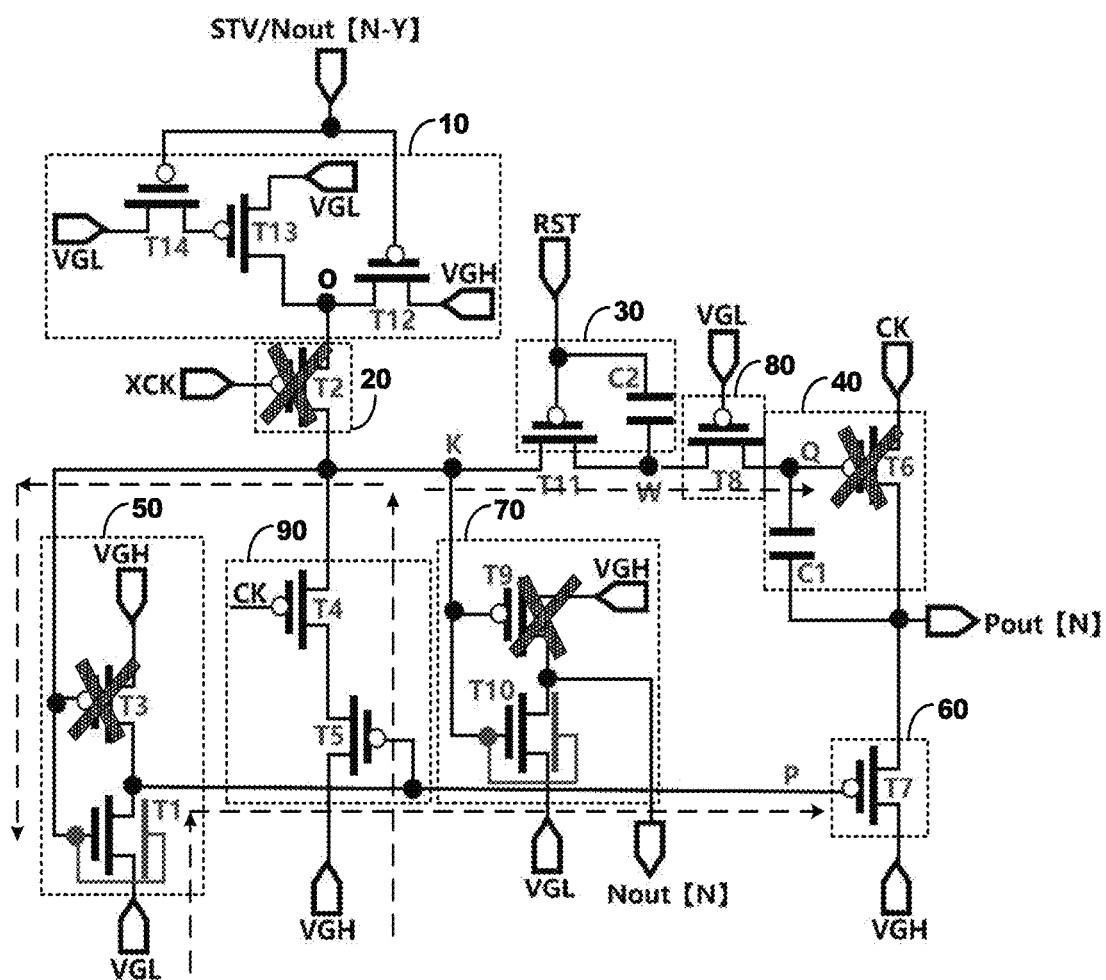
FIG. 5 is a schematic diagram of a state of the gate drive circuit shown in FIG. 3 in a first phase in FIG. 4.

The operation of the gate drive unit in one frame may include the following phases as shown in FIG. 4:

In a first phase S1, as shown in FIGS. 4 and 5, a start control signal STV, a reset signal RST, and a second clock signal CK are all at a low potential, the first clock signal XCK is at a high potential, the first node O, the second node K, and the third node Q are all at the high potential, the fourth node P is at the low potential, the N-th stage positive pulse scanning signal Nout[N] is at the low potential, and the N-th stage negative pulse scanning signal Pout[N] is at the high potential.

Figure 6:
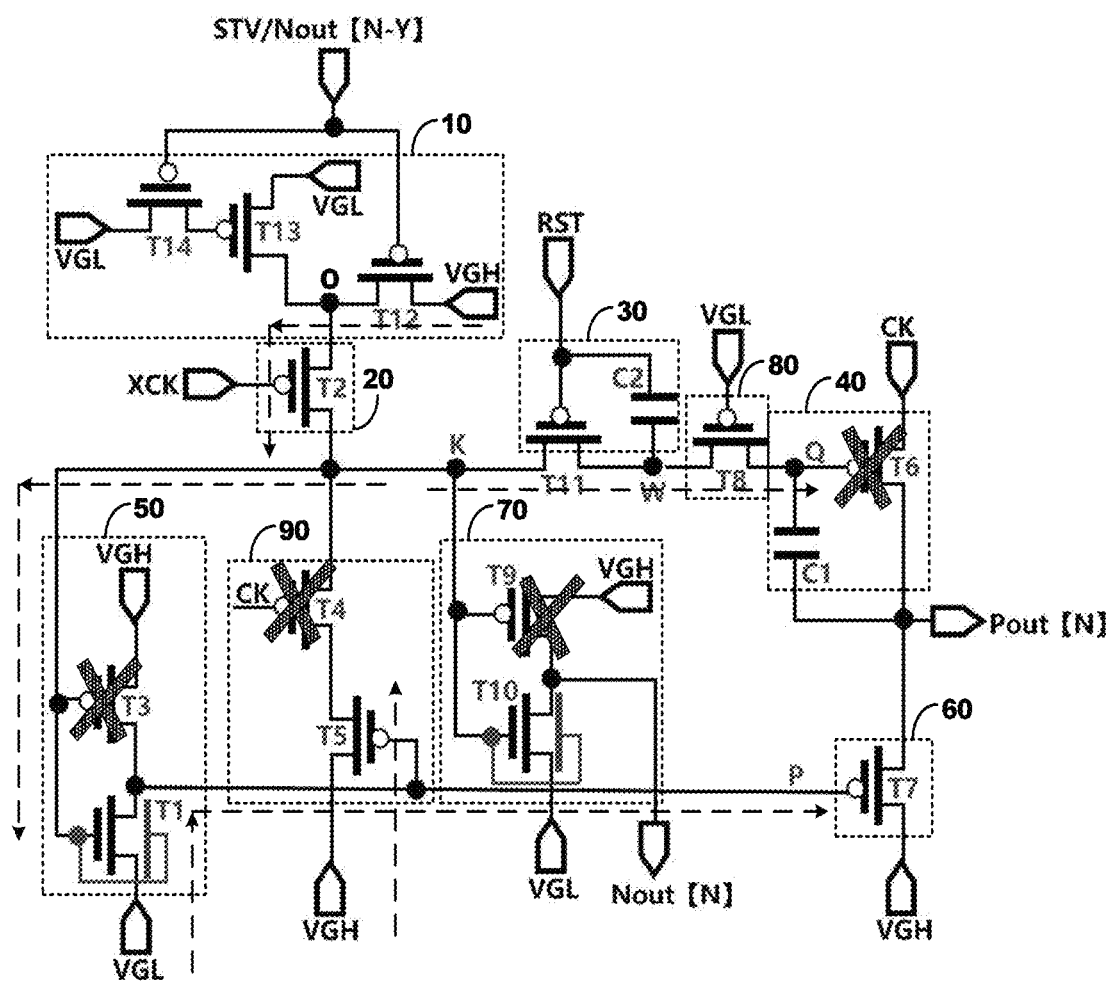
FIG. 6 is a schematic diagram of a state of the gate drive circuit shown in FIG. 3 in a second phase in FIG. 4.

In a second phase S2, as shown in FIGS. 4 and 6, the start control signal STV, the reset signal RST, and the first clock signal XCK are all at the low potential, the second clock signal CK is at the high potential, the first node O, the second node K, and the third node Q are all at the high potential, the fourth node P is at the low potential, the N-th stage positive pulse scanning signal Nout[N] is at the low potential, and the N-th stage negative pulse scanning signal Pout[N] is at the high potential.

Figure 7:
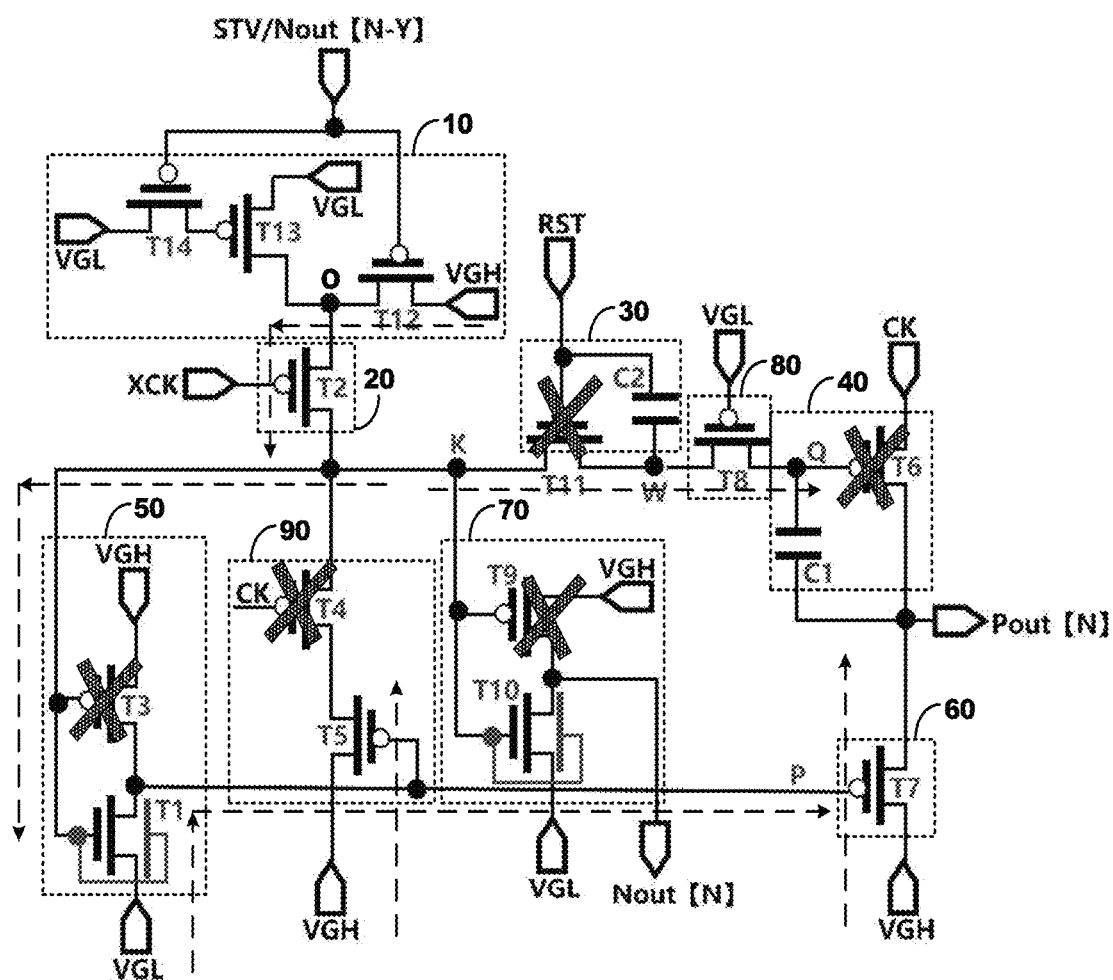
FIG. 7 is a schematic diagram of a state of the gate drive circuit shown in FIG. 3 in a third phase in FIG. 4.

In a third phase S3, as shown in FIGS. 4 and 7, the start control signal STV and the first clock signal XCK are all at the low potential, the reset signal RST and the second clock signal CK are all at the high potential, the first node O, the second node K and the third node Q are all at the high potential, the fourth node P is at the low potential, the N-th stage positive pulse scanning signal Nout[N] is at the low potential, and the N-th stage negative pulse scanning signal Pout[N] is at the high potential.

Figure 8:
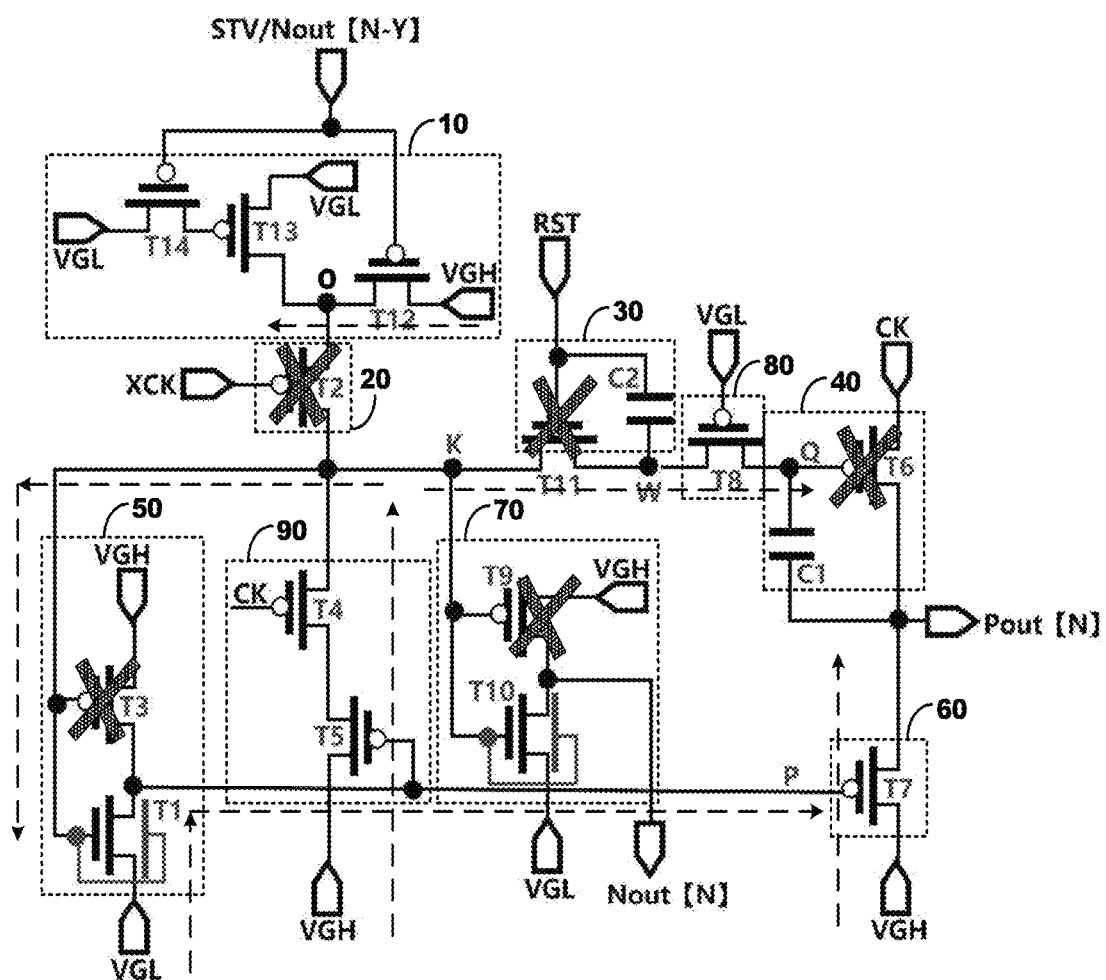
FIG. 8 is a schematic diagram of a state of the gate drive circuit shown in FIG. 3 in a fourth phase in FIG. 4.

In a fourth phase S4, as shown in FIGS. 4 and 8, the start control signal STV and the second clock signal CK are all at the low potential, the reset signal RST and the first clock signal XCK are all at the high potential, the first node O, the second node K and the third node Q are all at the high potential, the fourth node P is at the low potential, the N-th stage positive pulse scanning signal Nout[N] is at the low potential, and the N-th stage negative pulse scanning signal Pout[N] is at the high potential.

Figure 9:
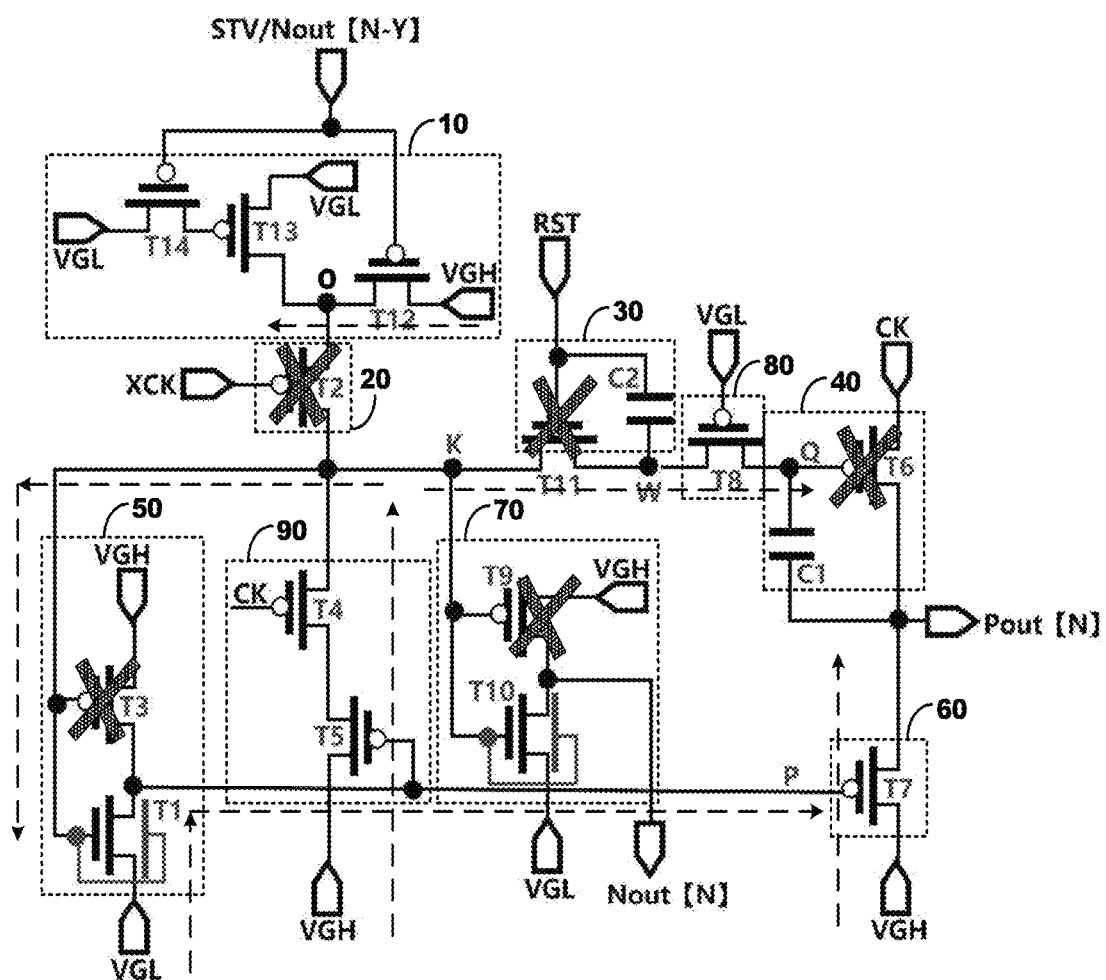
FIG. 9 is a schematic diagram of a state of the gate drive circuit shown in FIG. 3 in a fifth phase in FIG. 4.

In a fifth phase S5, as shown in FIGS. 4 and 9, the reset signal RST and the second clock signal CK are all at the low potential, the start control signal STV and the first clock signal XCK are all at the high potential, the second node K and the third node Q are all at the high potential, the first node O and the fourth node P are all at the low potential, the N-th stage positive pulse scanning signal Nout[N] is at the low potential, and the N-th stage negative pulse scanning signal Pout[N] is at the high potential.

Figure 10:
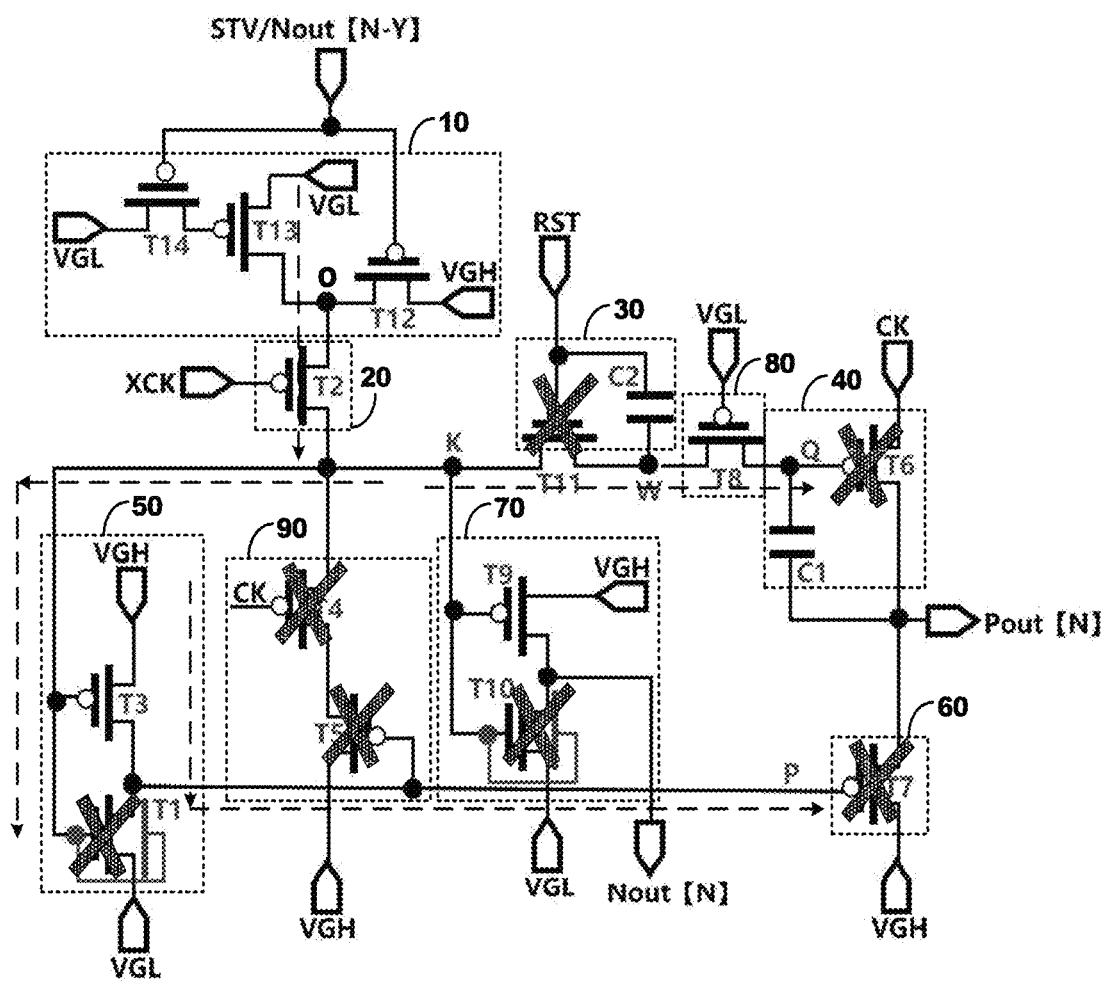
FIG. 10 is a schematic diagram of a state of the gate drive circuit shown in FIG. 3 in a sixth phase in FIG. 4.

In a sixth phase S6, as shown in FIGS. 4 and 10, the first clock signal XCK is at the low potential, the reset signal RST, the start control signal STV, and the second clock signal CK are all at the high potential, the second node K and the first node O are all at the low potential, the third node Q and the fourth node P are all at the high potential, the N-th stage positive pulse scanning signal Nout[N] is at the high potential, and the N-th stage negative pulse scanning signal Pout[N] is at the high potential.

Figure 11:
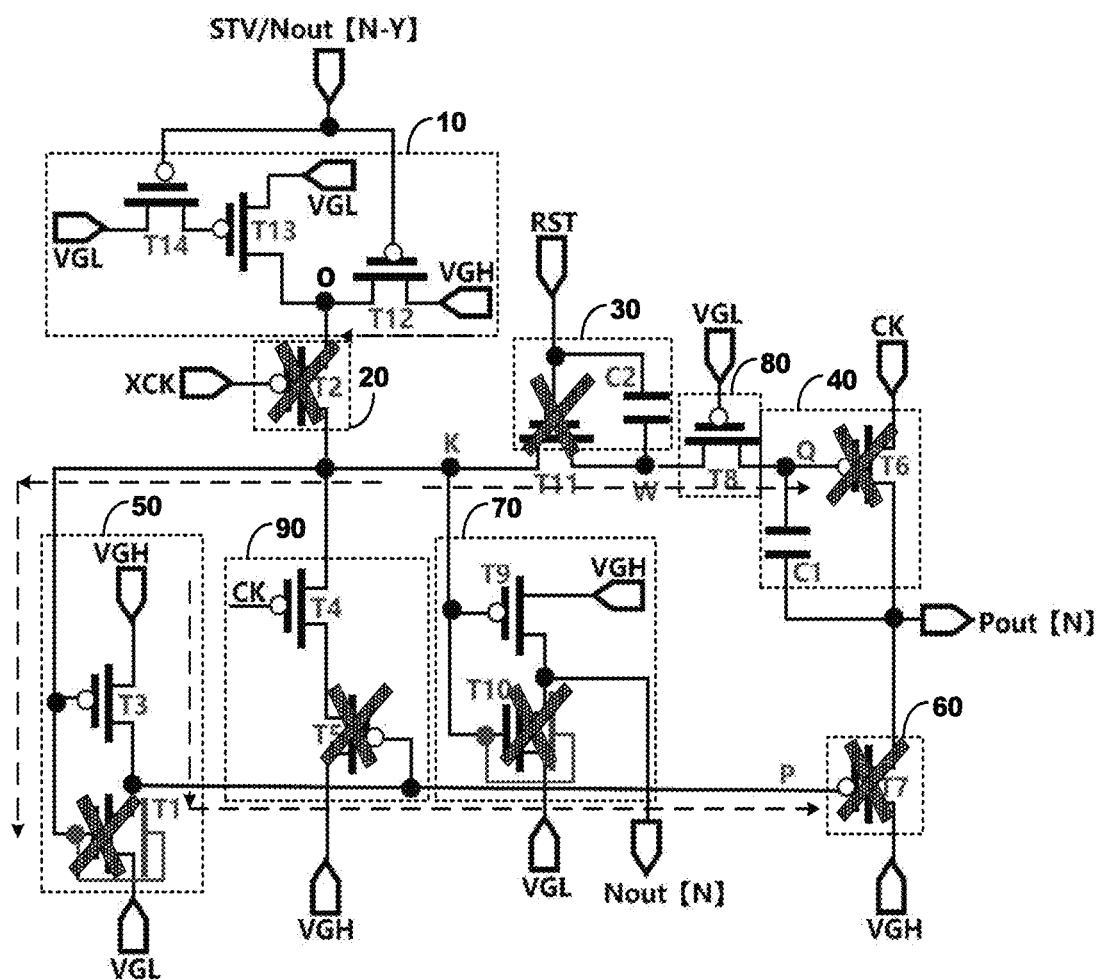
FIG. 11 is a schematic diagram of a state of the gate drive circuit shown in FIG. 3 in a seventh phase in FIG. 4.

In a seventh phase S7, as shown in FIGS. 4 and 11, the start control signal STV and the second clock signal CK are all at the low potential, the reset signal RST and the first clock signal XCK are all at the high potential, the second node K is at the low potential, the first node O, the third node Q and the fourth node P are all at the high potential, the N-th stage positive pulse scanning signal Nout[N] is at the high potential, and the N-th stage negative pulse scanning signal Pout[N] is at the high potential.

Figure 12:
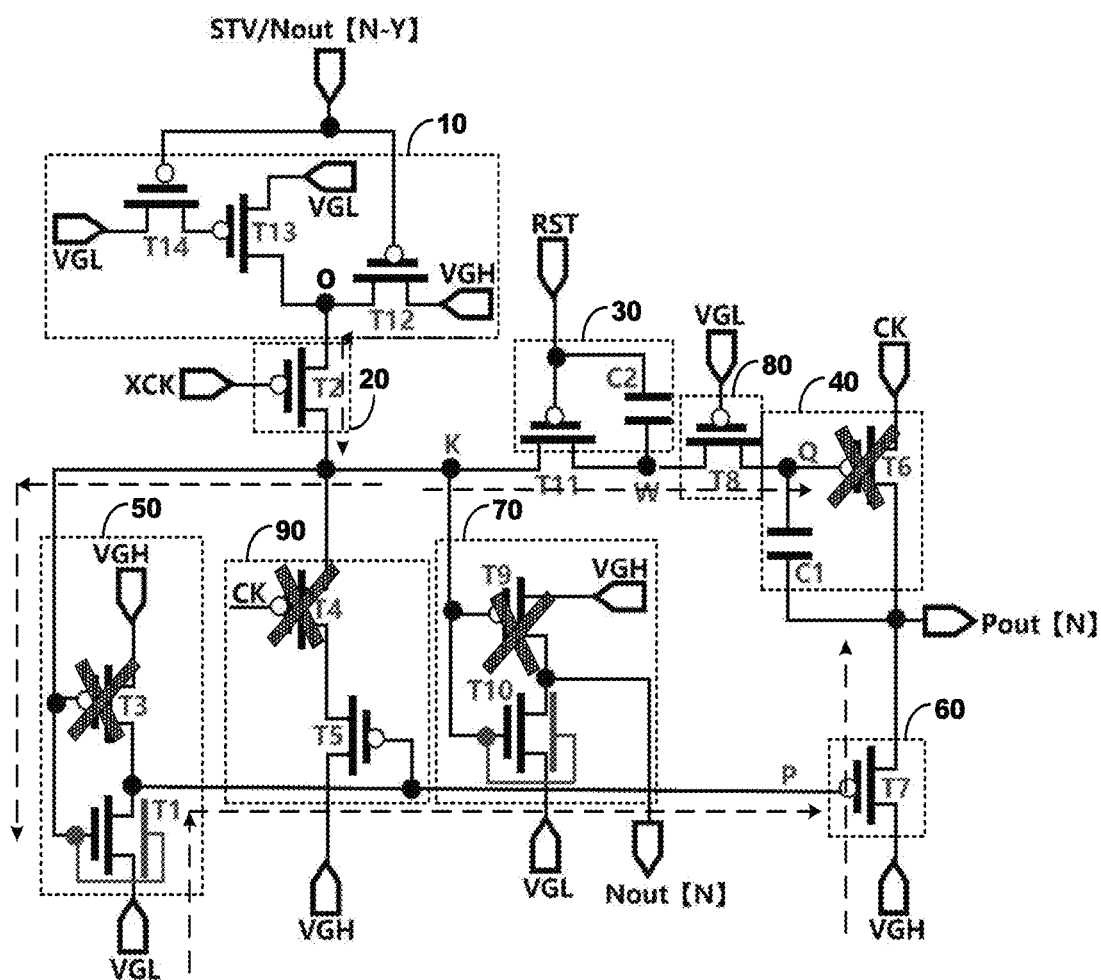
FIG. 12 is a schematic diagram of a state of the gate drive circuit shown in FIG. 3 in an eighth phase in FIG. 4.

In an eighth phase S8, as shown in FIGS. 4 and 12, the reset signal RST, the start control signal STV, and the first clock signal XCK are all at the low potential, the second clock signal CK is at the high potential, the fourth node P is at the low potential, the third node Q, and the second node K are all at the high potential, the N-th stage positive pulse scanning signal Nout[N] is at the low potential, and the N-th stage negative pulse scanning signal Pout[N] is at the high potential.

Figure 13:
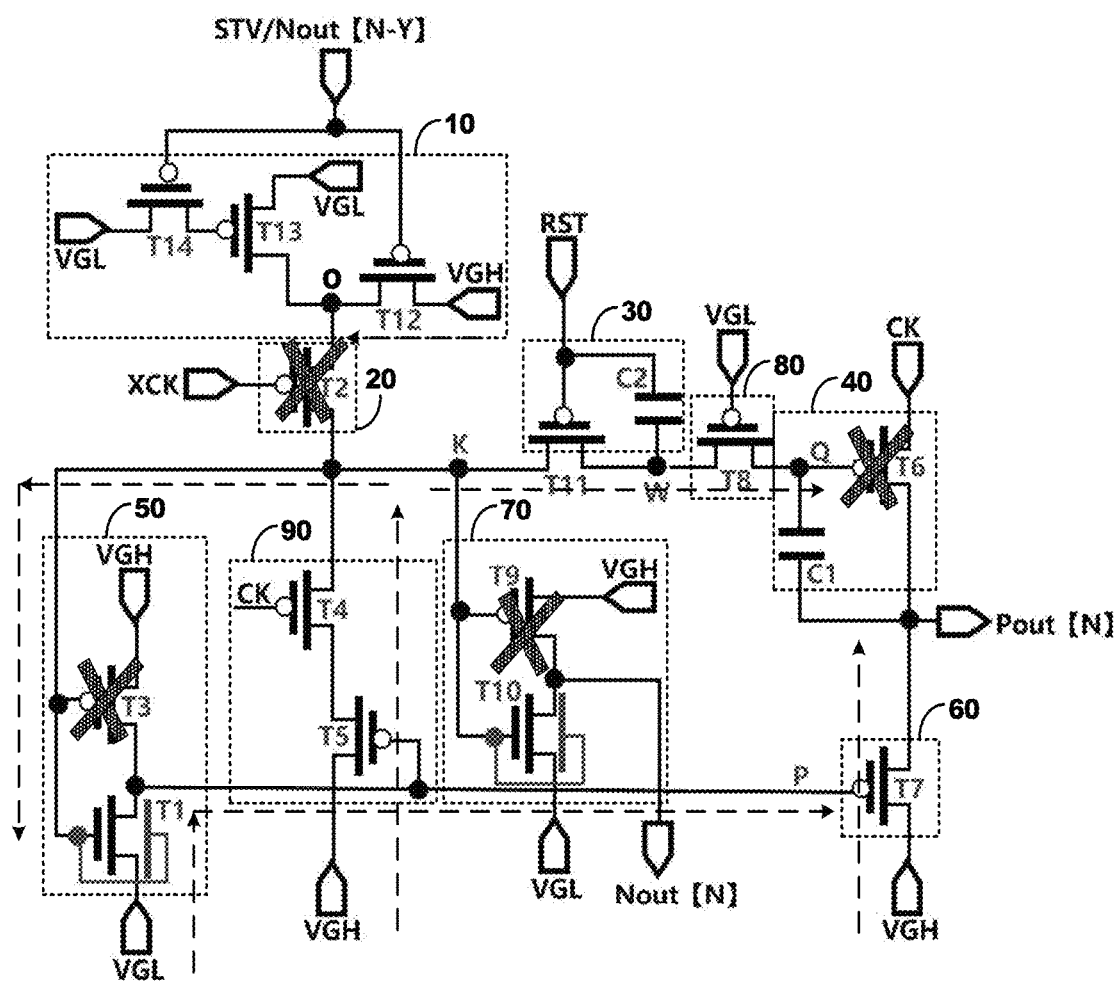
FIG. 13 is a schematic diagram of a state of the gate drive circuit shown in FIG. 3 in a ninth phase in FIG. 4.

In the ninth phase S9, as shown in FIGS. 4 and 13, the reset signal RST and the second clock signal CK are both at the low potential, the start control signal STV and the first clock signal XCK are at the high potential, the first node O and the fourth node P are at the low potential, the third node Q and the second node K are both at the high potential, the N-th stage positive pulse scanning signal Nout[N] is at the low potential, and the N-th stage negative pulse scanning signal Pout[N] is at the high potential.

Figure 14:
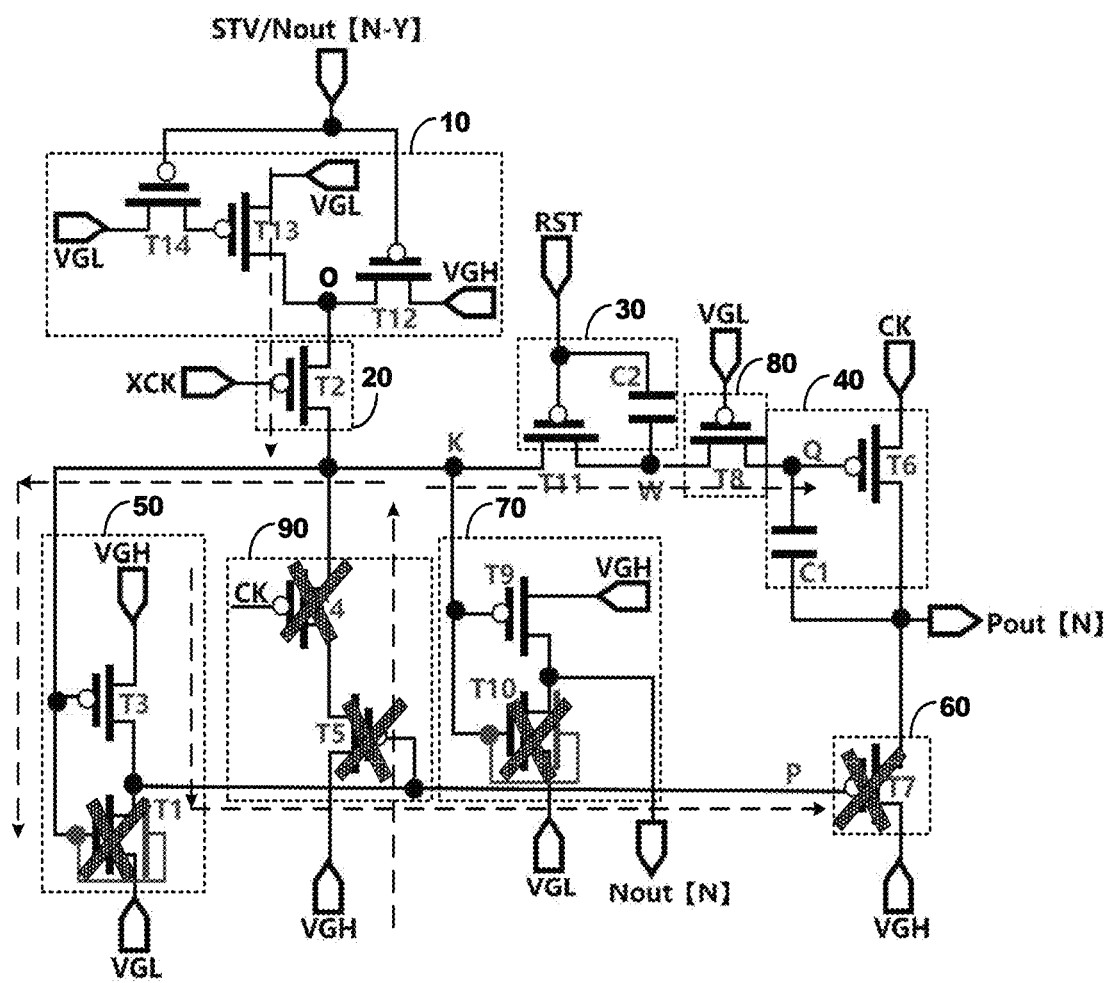
FIG. 14 is a schematic diagram of a state of the gate drive circuit shown in FIG. 3 in a tenth phase in FIG. 4.

In the tenth phase S10, as shown in FIGS. 4 and 14, the reset signal RST and the first clock signal XCK are both at the low potential, the start control signal STV and the second clock signal CK are at the high potential, the first node O, the third node Q and the second node K are at the low potential, the fourth node P is at a high potential, the N-th stage positive pulse scanning signal Nout[N] is at the high potential, and the N-th stage negative pulse scanning signal Pout[N] is at the high potential.

Figure 15:
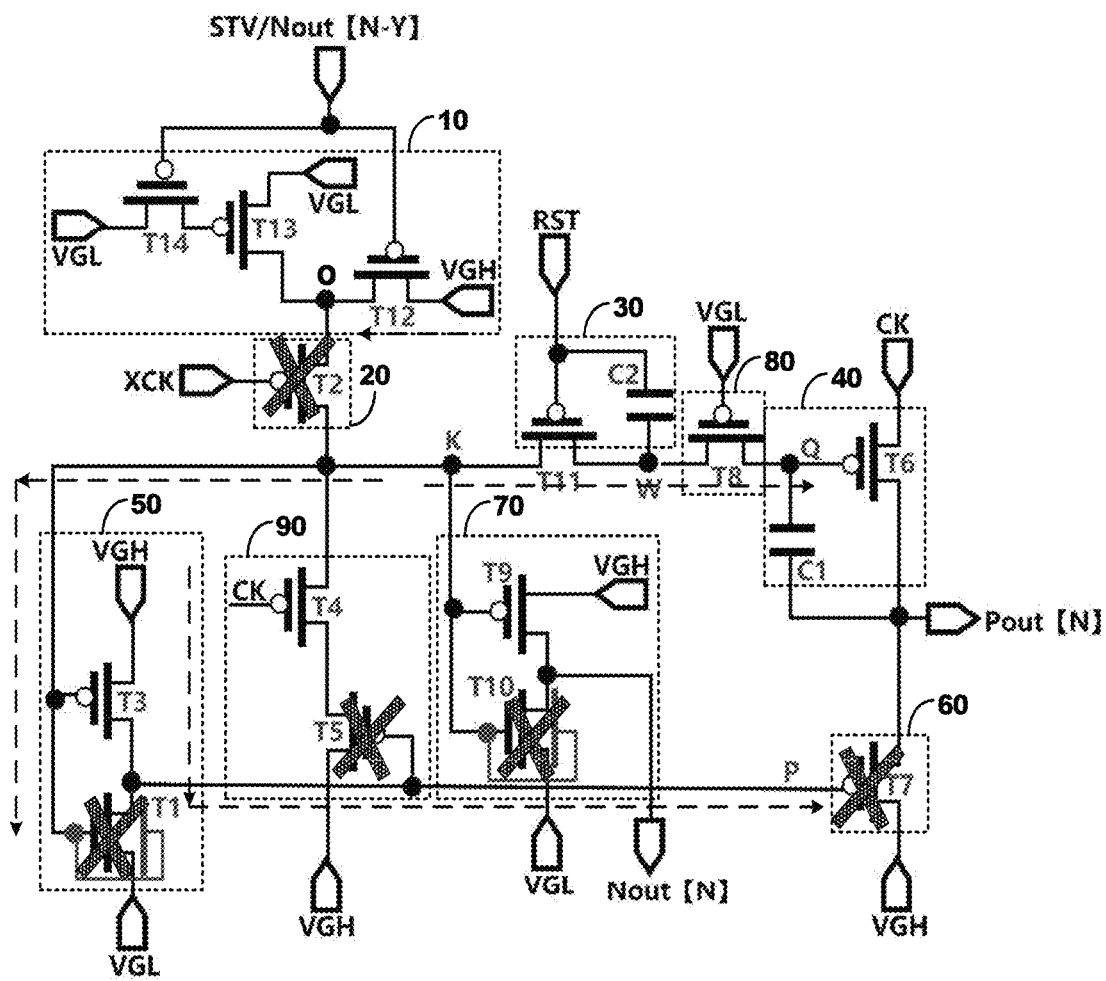
FIG. 15 is a schematic diagram of a state of the gate drive circuit shown in FIG. 3 in an eleventh phase in FIG. 4.

In an eleventh phase S11, as shown in FIGS. 4 and 15, the start control signal STV, the reset signal RST, and the second clock signal CK are all at the low potential, the first clock signal XCK is at the high potential, the third node Q, and the second node K are at the low potential, the first node O, and the fourth node P are at the high potential, the N-th stage positive pulse scanning signal Nout[N] is at the high potential, and the N-th stage negative pulse scanning signal Pout[N] is at the low potential.

It should be noted that the "✘" in FIGS. 5 to 15 indicates that the transistors covered by it are in a turn-off state. Dashed arrows in FIGS. 5 to 15 indicate a current direction.

As can be seen from FIG. 4, the N-th stage positive pulse scanning signal Nout[N] has a first positive pulse and a second positive pulse in sequence in a frame. The N-th stage negative pulse scanning signal Pout[N] has a first negative pulse in a frame.

In one frame, a duration of the second positive pulse is longer than a duration of the first negative pulse, and a duration of the first negative pulse is within the duration of the second positive pulse.

For example, a falling edge of the second positive pulse may occur at the same moment as a rising edge of the first negative pulse.

In an embodiment, a difference between a phase of the first clock signal XCK and a phase of the second clock signal CK is 180°. Each of a falling edge of the second clock signal CK, the falling edge of the second positive pulse, and the rising edge of the first negative pulse is within a duration in which the first clock signal XCK has a positive pulse.

Figure 16:
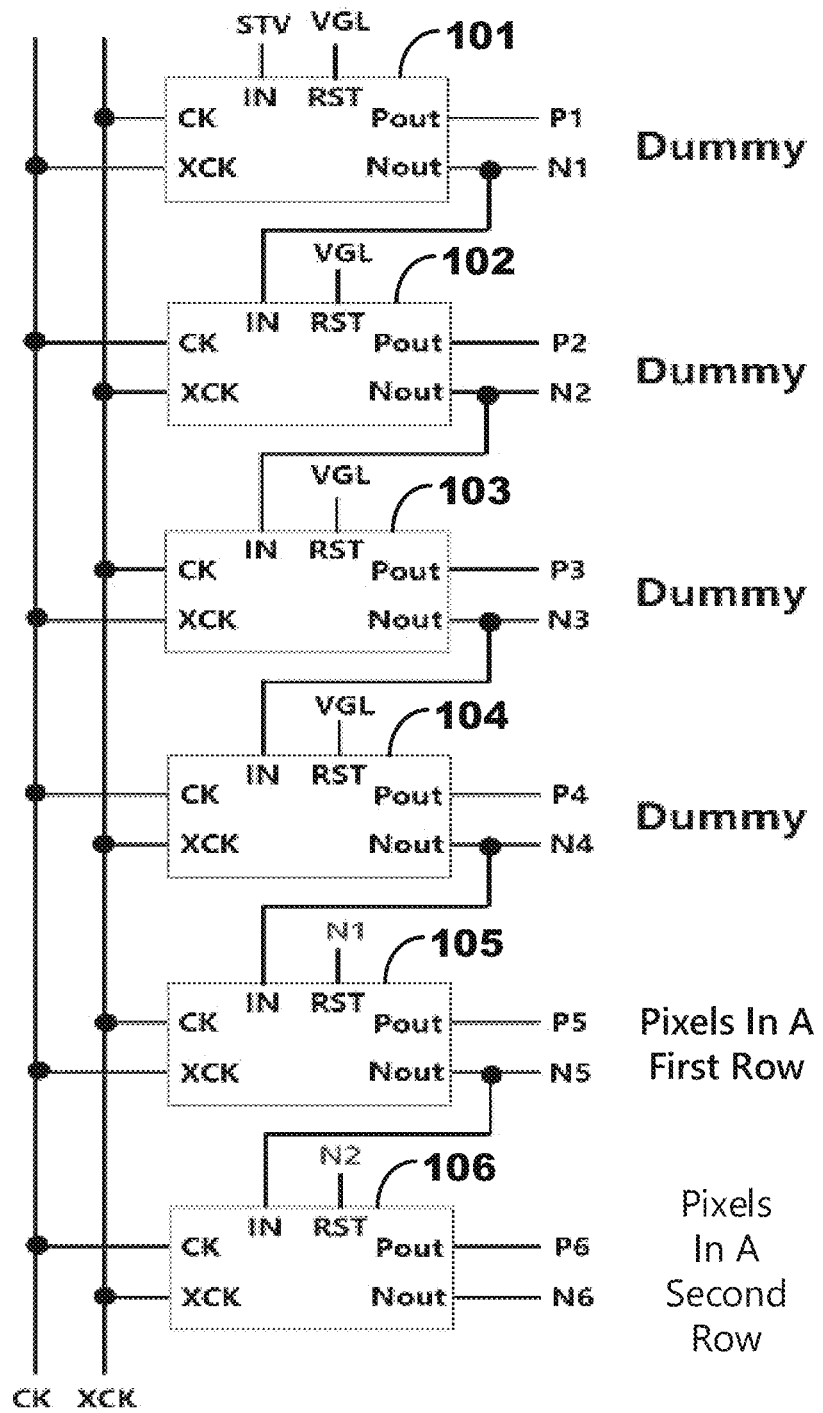
FIG. 16 is a schematic structural diagram of a cascade connection between different gate drive units in the gate drive circuit shown in FIG. 3.

FIG. 16 is a schematic structural diagram of a cascade connection between different gate drive units in the gate drive circuit shown in FIG. 3. in which a first gate drive unit 101, a second gate drive unit 102, a third gate drive unit 103, a fourth gate drive unit 104, a fifth gate drive unit 105, a sixth gate drive unit 106 or the like are sequentially arranged from top to bottom. The first clock lines are electrically connected to respective gate drive units, and the second clock lines are also electrically connected to respective gate drive units.

P1 to P6 may indicate a first negative pulse scanning line for transmitting a first negative pulse scanning signal, a second negative pulse scanning line for transmitting a second negative pulse scanning signal, a third negative pulse scanning line for transmitting a third negative pulse scanning signal, a fourth negative pulse scanning line for transmitting a fourth negative pulse scanning signal, a fifth negative pulse scanning line for transmitting a fifth negative pulse scanning signal, and a sixth negative pulse scanning line for transmitting a sixth negative pulse scanning signal, respectively. N1 to N6 may indicate a first positive pulse scanning line for transmitting a first positive pulse scanning signal, a second positive pulse scanning line for transmitting a second positive pulse scanning signal, a third positive pulse scanning line for transmitting a third positive pulse scanning signal, a fourth positive pulse scanning line for transmitting a fourth positive pulse scanning signal, a fifth positive pulse scanning line for transmitting a fifth positive pulse scanning signal, and a sixth positive pulse scanning line for transmitting a sixth positive pulse scanning signal, respectively.

An input terminal of the stage transmission signal selection circuit 10 in the first gate drive unit 101 is electrically connected to the start control line to receive the start control signal STV. The input terminal of the stage transmission signal selection circuit 10 in one of other gate drive units is connected to the positive pulse scanning line of a previous gate drive unit. For example, N1 is connected to the input terminal of the stage transmission signal selection circuit 10 in the second gate drive unit 102. N2 is connected to the input terminal of the stage transmission signal selection circuit 10 in the third gate drive unit 103. N3 is connected to the input terminal of the stage transmission signal selection circuit 10 in the fourth gate drive unit 104. N4 is connected to the input terminal of the stage transmission signal selection circuit 10 in the fifth gate drive unit 105. N5 is connected to the input terminal of the stage transmission signal selection circuit 10 in the sixth gate drive unit 106. Y may be 2, 3, 4, 5, 6, or the like. For example, Y is equal to 1.

The control terminal of the pulse number reduction circuit 30 in the fifth gate drive unit 105 is connected to N1, and the control terminal of the pulse number reduction circuit 30 in the sixth gate drive unit 106 is connected to N2, and so on. X may be 3, 4, 5, 6, 7, or the like. The illustration is provided by using X equals 4.

Each of the output terminals of the first gate drive unit 101 to the fourth gate drive unit 104 is not used to drive a pixel circuit for display, but is connected to a dummy pixel or is float. Respective output terminals of the fifth gate drive unit 105 are electrically connected to the pixel circuits (Pixel) in a first row, and respective output terminals of the sixth gate drive unit 106 are electrically connected to the pixel circuits (Pixel) in the second row.

Figure 17:
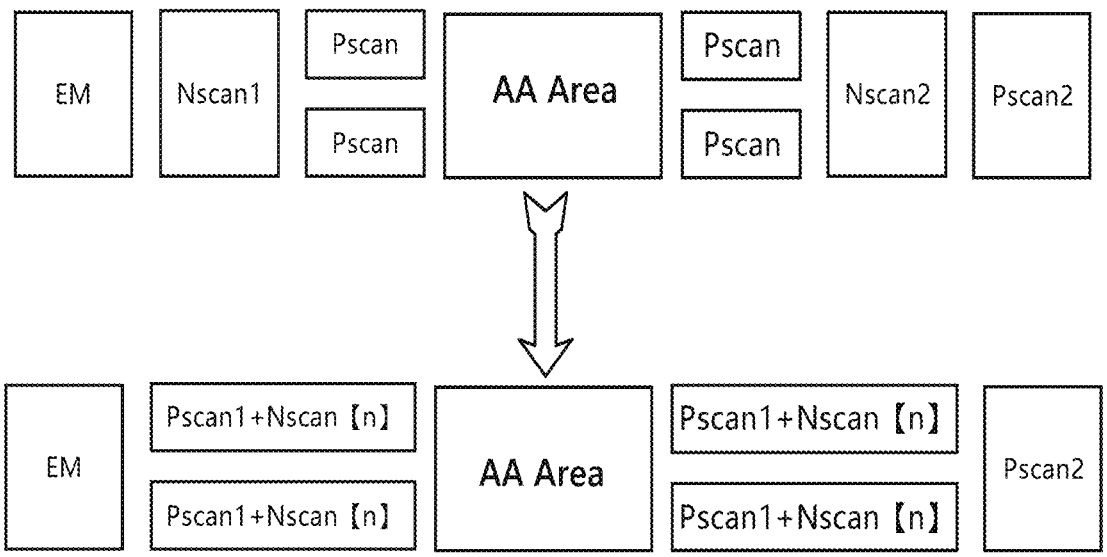
FIG. 17 is a schematic structural diagram of a display panel according to an embodiment of the present application.

FIG. 17 is a schematic structural diagram of a conventional display panel. Gate drive circuits for respectively supplying a light emission control signal EM, a scanning signal Nscan1, and a scanning signal Pscan are arranged on a left side area (a non-display area or a frame area) of a display area (AA area). Gate drive circuits for respectively supplying a scanning signal Pscan, a scanning signal Nscan2, and a scanning signal Pscan2 are respectively arranged on a right side area (a non-display area or a frame area) of the display area (AA area).

Each scanning signal Pscan drives pixel circuits in a corresponding row of rows. Each of the scanning signal Nscan1 and the scanning signal Nscan2 operates in the same manner as the scanning signal Pscan, but may drive the pixel circuits in two of the rows. In practical operation, in order to realize a narrower frame, both the gate drive circuit for outputting the scanning signal Nscan1 and the gate drive circuit for outputting the scanning signal Nscan2 are set to be single-sided driven. However, this causes the driving capability of the two gate drive circuits to be deteriorated and the power consumption to be increased.

In view of above, in an embodiment, the gate drive circuit shown in FIG. 3 is provided as a double-sided drive circuit shown in FIG. 17. That is, each of the two opposite sides of the AA region are provided with the gate drive circuit shown in FIG. 3. Therefore, scanning signals are transmitted to the AA region from both ends of each scanning line at the same time. This not only improves the driving capability of the positive pulse scanning signal (Nscan) while reducing the power consumption, but also reduces the space occupied by the frame, thereby facilitating the development of a narrower frame.

In an embodiment, provided is a display panel including a gate drive circuit and a pixel circuit in at least one of the embodiment described above. pixel circuits in a row is electrically connected to an N-th stage positive pulse scanning line and an N-th stage negative pulse scanning line.

It will be appreciated that the display panel according to an embodiment includes the gate drive circuit in at least one of the above-described embodiments, the second gate control signal with most pulses may output through the stage transmission signal selection circuit 10, the pull-up control circuit 20, and the second output stage 70. The second gate control signal is set as a stage transmission signal between different gate drive units. The gate drive circuit according an embodiment of the present application may output a first gate control signal with less pulses through the stage transmission signal selection circuit 10, the pull-up control circuit 20, the pulse number reduction circuit 30, the first inversion circuit 50, and the first output stage. Therefore, the gate drive circuit according an embodiment of the present application may meet a need of the pixel circuit for the pulse of the gate control signal in terms of time, number, or the like in a frame, and the pixel circuit is driven to improve display quality of pictures.

In addition, in the gate drive circuit and the display panel according an embodiment of the present application, by configuring at least one of the stage transmission signal selection circuit 10, the first inversion circuit 50, and the second output stage 70 including three transistors of the same channel type, the at least one of the stage transmission signal selection circuit 10, the first inversion circuit 50, and the second output stage 70 with an inverter effect is formed from less transistors with the same channel type, as compared with a current inversion circuit formed by two transistors of different channel types or four transistors of the same channel type. Therefore, the manufacturing process is simplified and the dynamic performance is improved.

Figure 18:
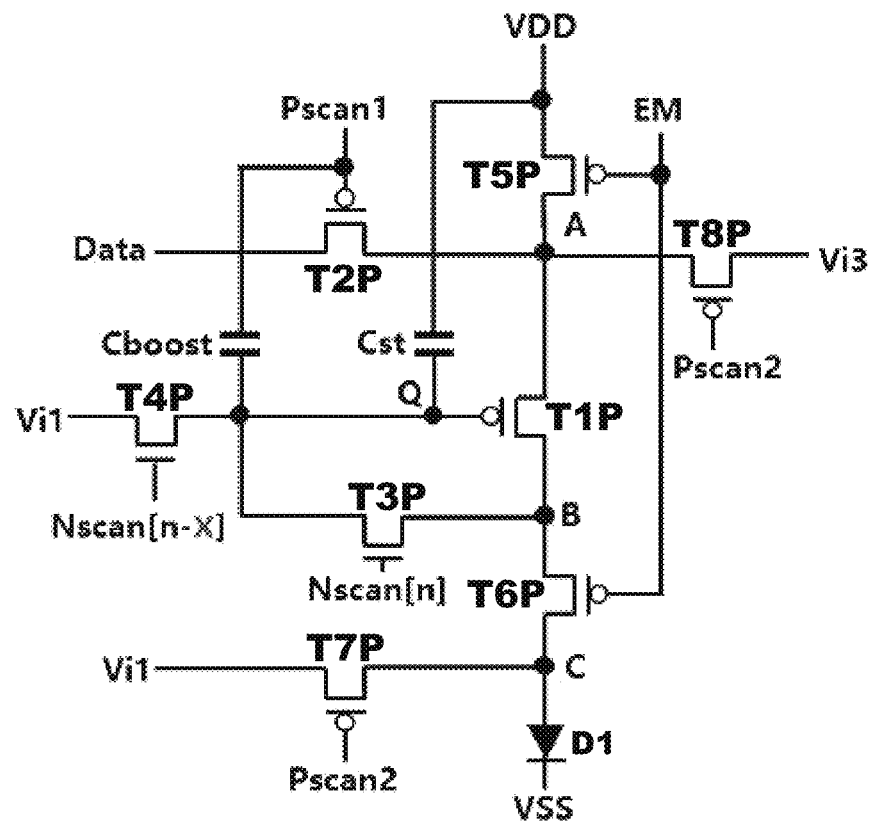
FIG. 18 is a schematic structural diagram of a pixel circuit in the display panel shown in FIG. 17.

FIG. 18 is a schematic structural diagram of a pixel circuit in the display panel shown in FIG. 17. It will be appreciated that the gate drive circuit shown in FIG. 3 may provide the pixel circuit shown in FIG. 18 with a scanning signal Nscan[n], a scanning signal Nscan[n-X], and a scanning signal Pscan1.

The pixel circuit shown in FIG. 18 may include at least one of a writing transistor T2P, a drive transistor T1P, a first light-emitting control transistor T5P, a second light-emitting control transistor T6P, a first initialization transistor T4P, a first initialization transistor T4P, a third initialization transistor T8P, a compensation transistor T3P, a light-emitting device D1, a storage capacitor Cst, or a bootstrap capacitor Cboost.

The first power supply line is electrically connected to a first electrode of the first light-emitting control transistor T5P and one terminal of the storage capacitor Cst. A second electrode of the first light-emitting control transistor T5P is electrically connected to a first electrode of the drive transistor T1P and a first electrode of the writing transistor T2P. A second electrode of the drive transistor T1P is electrically connected to a first electrode of the compensation transistor T3P and a first electrode of the second light-emitting control transistor T6P. A second electrode of the second light-emitting control transistor T6P is electrically connected to a first electrode of the first initialization transistor T4P and an anode of the light-emitting device D1. A cathode of the light-emitting device D1 is electrically connected to a second power supply line. A light emission control line is electrically connected to a gate of the first light emission control transistor T5P and a gate of the second light emission control transistor T6P. A second electrode of the writing transistor T2P is electrically connected to a data line. A gate of the writing transistor T2P is electrically connected to the first scan line and one terminal of the bootstrap capacitor Cboost. A second electrode of the first initialization transistor T4P is electrically connected to a second initialization line. A gate of the first initialization transistor T4P is electrically connected to a second scan line. A second electrode of the compensation transistor T3P is electrically connected to a gate of the drive transistor T1P. A gate of the compensation transistor T3P is electrically connected to a third scan line. The gate of the drive transistor T1P is electrically connected to the other terminal of the storage capacitor Cst, the other terminal of the bootstrap capacitor Cboost, and the first electrode of the first initialization transistor T4P. A second electrode of the first initialization transistor T4P is electrically connected to the first initialization line, and the gate of the first initialization transistor T4P is electrically connected to a fourth scan line. A first electrode of the third initialization transistor T8P is electrically connected to the first electrode of the drive transistor T1P, a second electrode of the third initialization transistor T8P is electrically connected to a third initialization line, and a gate of the third initialization transistor T8P and a gate of the first initialization transistor T4P share the second scan line.

It should be noted that the second initialization line may be replaced with the first initialization line, so that a wiring required by the pixel circuit can be reduced, thereby facilitating increasing the density of the pixel circuit in the display panel.

The first electrode may be one of a source electrode or a drain electrode, and the second electrode may be the other of the source electrode or the drain electrode. For example, when the first electrode is a source, the second electrode may be a drain; Alternatively, when the first electrode is a drain electrode, the second electrode may be a source electrode.

The first power supply line is used to transmit the positive power supply signal VDD and the second power supply line is used to transmit the negative power supply signal VSS.

The potential of the positive power supply signal VDD is higher than the potential of the negative power supply signal VSS. The data line is used to transmit the data signal Data. The light-emitting control line is used for transmitting the light-emitting control signal EM. The first initialization line is used to transmit the first initialization signal Vi1. The second initialization line is used for transmitting the second initialization signal. The third initialization line is used to transmit the third initialization signal Vi3. The first scan line is used to transmit the scanning signal Pscan1. The second scan line is used to transmit the scanning signal Pscan2. The third scan line is used to transmit the scanning signal Nscan[n]. The fourth scan line is used to transmit the scanning signal Nscan[n-X].

Figure 19:
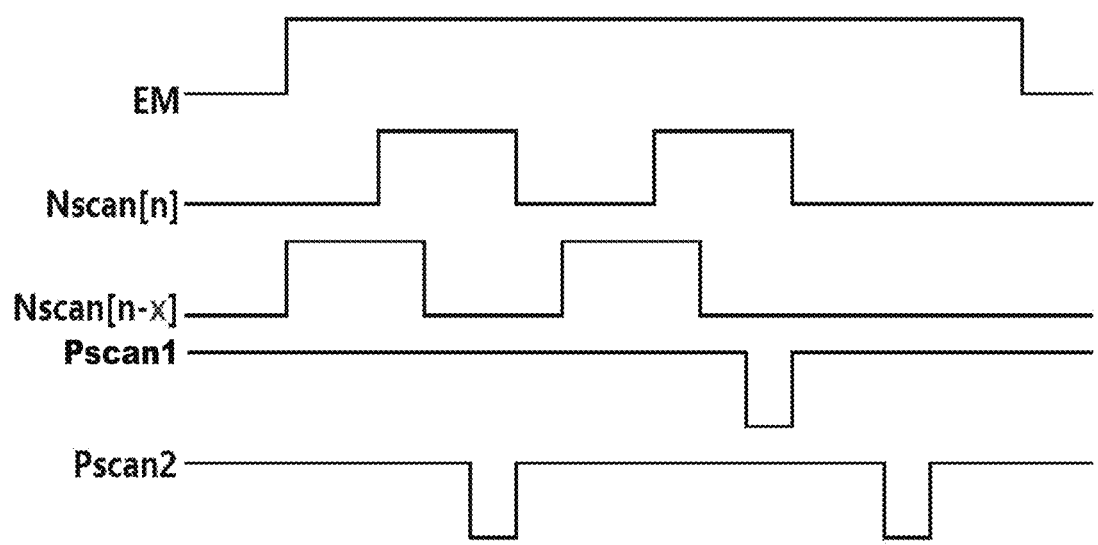
FIG. 19 is a schematic timing diagram of the pixel circuit shown in FIG. 18.

The operation timing of the pixel circuit shown in FIG. 18 in one frame is shown in FIG. 19. The pixel circuit shown in FIG. 18 may be normally operated for displaying based on the scanning signal Pscan1, the scanning signal Pscan2, the scanning signal Nscan[n-X], the scanning signal Nscan[n], or the light emission control signal EM.

The scanning signal Pscan1, the scanning signal Nscan[n-X], and the scanning signal Nscan[n] may be provided by the gate drive circuit shown in FIG. 3. The scanning signal Pscan1 is same as the N-th stage negative pulse scanning signal Pout[N], the scanning signal Nscan[n] is same as the N-th stage positive pulse scanning signal Nout[N], and the scanning signal Nscan[n-X] is same as the (N-X)-th stage positive pulse scanning signal Nout[N-X].

It will be appreciated that equivalent replacements or changes may be made by those of ordinary skill in the art based on the above embodiments of the present application, and all such replacements or changes should fall within the scope of the appended claims.

What is claimed is:

1. A display panel, comprising:
a gate drive circuit, comprising M cascaded gate drive units, wherein at least one of the gate drive units comprises a first output stage configured to output a first gate control signal and a second output stage configured to output a second gate control signal, and wherein M is an integer greater than 1 and N is an integer greater than 0 and less than M; and
a pixel circuit connected to an N-th stage gate drive unit of the at least one of the gate drive units and comprising at least a first thin film transistor and a second thin film transistor, wherein the first thin film transistor has a channel type different from that of the second thin film transistor, and wherein a gate of the first thin film transistor and a gate of the second thin film transistor are connected to the first output stage and the second output stage of N-th stage gate drive unit to receive the first gate control signal and the second gate control signal, respectively,
wherein a number of pulses and a pulse width of the second gate control signal in one frame both are different from a number of pulses and a pulse width of the first gate control signal in the one frame.

2. The display panel of claim 1, wherein the N-th stage gate drive unit further comprises:
a stage transmission signal selection circuit electrically connected between a first wiring and a first node;
a pull-up control circuit configured to control a potential of a second node based on a potential of the first node and a potential of a first clock signal;
a pulse number reduction circuit electrically connected between the second node and a third node, wherein the pulse number reduction circuit has a control terminal electrically connected to a reset line; and
a first inversion circuit connected between the second node and a fourth node;
wherein the first output stage of the N-th stage gate drive unit is configured to output the first gate control signal based on a potential of the third node and a potential of the fourth node and the second output stage is configured to output the second gate control signal based on the potential of the second node.

3. The display panel of claim 2, wherein at least one of the stage transmission signal selection circuit, the first inversion circuit or the second output stage comprises three transistors with a same channel type.

4. The display panel of claim 3, wherein the at least one of the stage transmission signal selection circuit, the first inversion circuit or the second output stage comprises:
a first transistor, wherein one of a source of the first transistor and a drain of the first transistor is electrically connected to a low potential line, a gate of the first transistor is electrically connected to the first wiring, and the first transistor is a P-channel type thin film transistor;
a second transistor, wherein a gate of the second transistor is electrically connected to the gate of the first transistor, one of a source of the second transistor and a drain of the second transistor is electrically connected to a high potential line, another one of the source of the second transistor and the drain of the second transistor is electrically connected to the first node, and the second transistor is a P-channel type thin film transistor; and
a third transistor, wherein a gate of the third transistor is electrically connected to another one of the source of the first transistor and the drain of the first transistor, one of a source of the third transistor and a drain of the third transistor is electrically connected to the low potential line, another one of the source of the third transistor and the drain of the third transistor is electrically connected to the first node, and the third transistor is a P-channel type thin film transistor.

5. The display panel of claim 3, wherein a ratio of a width of a channel of the first transistor to a length of the channel of the first transistor is greater than 1.5, a ratio of a width of a channel of the second transistor to a length of the channel of the second transistor is in a range of 0.5~3, and a ratio of a width of a channel of the third transistor to a length of the channel of the third transistor is in a range of 0.5~3.

6. The display panel of claim 2, wherein the pulse number reduction circuit comprises a fourth transistor, one of a source of the fourth transistor and a drain of the fourth transistor is electrically connected to the second node, another one of the source of the fourth transistor and the drain of the fourth transistor is electrically connected to the third node, and a gate of the fourth transistor is electrically connected to the reset line.

7. The display panel of claim 6, wherein a ratio of a width of a channel of the fourth transistor to a length of the channel of the fourth transistor is greater than or equal to 0.5 and less than or equal to 1.5.

8. The display panel of claim 6, wherein the pulse number reduction circuit further comprises a first capacitor, a terminal of the first capacitor is electrically connected to the gate of the fourth transistor, and another terminal of the first capacitor is electrically connected to the another one of the source of the fourth transistor and the drain of the fourth transistor.

9. The display panel of claim 8, wherein the first output stage comprises:
- a pull-up transistor, wherein a gate of the pull-up transistor is electrically connected to the third node, one of a source of the pull-up transistor and a drain of the pull-up transistor is electrically connected to a second clock line, and another one of the source of the pull-up transistor and the drain of the pull-up transistor is configured to output the first gate control signal; and
- a second capacitor, wherein a terminal of the second capacitor is electrically connected to the gate of the pull-up transistor and another terminal of the second capacitor is electrically connected to the another one of the source of the pull-up transistor and the drain of the pull-up transistor,
- wherein a ratio of a capacity of the first capacitor to a capacity of the second capacitor is greater than or equal to 0.5.

10. The display panel of claim 2, wherein the first gate control signal of the N-th stage gate drive unit is an N-th stage negative pulse scanning signal, the second gate control signal of the N-th stage gate drive unit is an N-th stage positive pulse scanning signal, and the control terminal of the pulse number reduction circuit of the N-th stage gate drive unit is configured to an (N-X)-th stage positive pulse scanning signal, where N is an integer greater than or equal to 1 and X is an integer greater than or equal to 2 and less than N.

11. The display panel of claim 10, wherein the pixel circuit is further connected to an (N-X)-th stage gate drive unit of the at least one of the gate drive units and further comprises a first initialization transistor, and the first initialization transistor has a gate connected to the at least one of the first output stage and the second output stage of the (N-X)-th stage gate drive unit to receive the (N-X)-th stage positive pulse scanning signal.

12. The display panel of claim 10, wherein the stage transmission signal selection circuit is configured to receive one of a start control signal or an (N-Y)-th stage positive pulse scanning signal, where Y is an integer greater than or equal to 1 and less than N.

13. The display panel of claim 1, wherein the second gate control signal has a first positive pulse and a second positive pulse in sequence in the one frame, and
the first gate control signal has a first negative pulse in the one frame.

14. The display panel of claim 13, wherein in one frame, a duration of the second positive pulse is longer than a duration of the first negative pulse, and the duration of the first negative pulse is within the duration of the second positive pulse.

15. The display panel of claim 14, the pull-up control circuit has a control terminal electrically connected to a first clock line for transmitting the first clock signal, the first output stage is electrically connected to a second clock line for transmitting a second clock signal, and a difference between a phase of the first clock signal and a phase of the second clock signal is 180°; and
each of a falling edge of the second clock signal, a falling edge of the second positive pulse, and a rising edge of the first negative pulse is within a duration of a positive pulse of the first clock signal.

16. The display panel of claim 1, wherein
the pixel circuit is further connected to an (N-X)-th stage gate drive unit of the at least one of the gate drive units and receives at least one of the first gate control signal and the second gate control signal output from the (N-X)-th stage gate drive unit, and wherein X is an integer greater than 1 and less than N.

17. The display panel of claim 16, wherein
the pixel circuit further comprises a third thin-film transistor, and a gate of the third thin-film transistor is connected to the at least one of the first output stage and the second output stage of the (N-X)-th stage gate drive unit.

18. The display panel of claim 1, wherein the number of pulses and the pulse width of the second gate control signal in the one frame both are greater than the number of pulses and the pulse width of the first gate control signal in the one frame.

19. The display panel of claim 1, wherein at least one of the gate drive units is connected to a dummy pixel or is float.

* * * * *